(12) United States Patent
Lue et al.

(10) Patent No.: US 8,759,899 B1
(45) Date of Patent: Jun. 24, 2014

(54) INTEGRATION OF 3D STACKED IC DEVICE WITH PERIPHERAL CIRCUITS

(71) Applicants: Hang-Ting Lue, Hsinchu (TW);
Yi-Hsuan Hsiao, Budai Township (TW);
Shih-Hung Chen, Jhudong Township (TW); Yen-Hao Shih, New Taipei (TW)

(72) Inventors: Hang-Ting Lue, Hsinchu (TW);
Yi-Hsuan Hsiao, Budai Township (TW);
Shih-Hung Chen, Jhudong Township (TW); Yen-Hao Shih, New Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/739,914

(22) Filed: Jan. 11, 2013

(51) Int. Cl.
*H01L 29/788* (2006.01)

(52) U.S. Cl.
USPC .................. 257/315; 257/506; 257/E21.645

(58) Field of Classification Search
USPC .................................. 257/315, 506, E21.645
See application file for complete search history.

(56) References Cited

U.S. PATENT DOCUMENTS

| | | | |
|---|---|---|---|
| 6,034,882 A | 3/2000 | Johnson et al. | |
| 6,906,361 B2 | 6/2005 | Zhang | |
| 6,906,940 B1 | 6/2005 | Lue | |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,315,474 B2 | 1/2008 | Lue | |
| 7,420,242 B2 | 9/2008 | Lung | |
| 7,851,849 B2 | 12/2010 | Kiyotoshi | |
| 2005/0280061 A1 | 12/2005 | Lee | |
| 2007/0090434 A1* | 4/2007 | Davies et al. | 257/301 |
| 2007/0140001 A1 | 6/2007 | Motoi et al. | |
| 2007/0252201 A1* | 11/2007 | Kito et al. | 257/331 |
| 2008/0073635 A1 | 3/2008 | Kiyotoshi et al. | |
| 2008/0096327 A1 | 4/2008 | Lee et al. | |
| 2008/0101109 A1 | 5/2008 | Haring-Bolivar et al. | |
| 2008/0175032 A1 | 7/2008 | Tanaka et al. | |
| 2008/0180994 A1 | 7/2008 | Katsumata et al. | |

(Continued)

FOREIGN PATENT DOCUMENTS

| | | |
|---|---|---|
| EP | 1936681 A1 | 6/2008 |
| EP | 2048709 A2 | 4/2009 |

OTHER PUBLICATIONS

Jung et al., "Three Dimensionally Stacked NAND Flash Memory Technology Using Stacking Single Crystal Si Layers on ILD and TANOS Structure for Beyond 30nm Node," IEEE IEDM, Dec. 11-13, 2006, 4 pages.

(Continued)

*Primary Examiner* — Thanh V Pham
(74) *Attorney, Agent, or Firm* — Yiding Wu; Haynes Beffel & Wolfeld LLP

(57) ABSTRACT

An integrated circuit device includes a substrate including a first region and a second region. A pit is formed in the first region. A stack of active layers alternating with insulating layers is deposited in the pit. The stack includes a particular insulating layer. The particular insulating layer has a first thickness, where a sum of the first thickness, thickness of active layers, and thicknesses of other insulating layers is essentially equal to a depth of the pit. The first thickness is different than the thicknesses of the other insulating layers by an amount within a range of process variations for the depth of the pit, for the thicknesses of the active layers, and for the thicknesses of other insulating layers. The device includes a planarized surface over the first and second regions, where an uppermost one of the active layers has a top surface below the planarized surface.

8 Claims, 19 Drawing Sheets

(56) References Cited

U.S. PATENT DOCUMENTS

| | | |
|---|---|---|
| 2008/0247230 A1 | 10/2008 | Lee et al. |
| 2008/0285350 A1 | 11/2008 | Yeh |
| 2009/0097321 A1 | 4/2009 | Kim et al. |
| 2009/0184360 A1 | 7/2009 | Jin et al. |
| 2009/0310425 A1* | 12/2009 | Sim et al. .................. 365/185.29 |
| 2010/0270593 A1 | 10/2010 | Lung et al. |

OTHER PUBLICATIONS

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Paul et al., "Impact of a Process Variation on Nanowire and Nanotube Device Performance," IEEE Trans. on Electron Devices, vol. 54, No. 9, Sep. 2007, pp. 2369-2376.

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Fukuzumi et al. "Optimal Integration and Characteristics of Vertical Array Devices for Ultra-High Density, Bit-Cost Scalable Flash Memory," IEEE Dec. 2007, pp. 449-452.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

* cited by examiner

INTEGRATION OF 3D STACKED IC DEVICE WITH PERIPHERAL CIRCUITS

BACKGROUND OF THE INVENTION

1. Field of the Invention

The present invention relates to stacked transistor structures, such as can be used in high density three-dimensional (3D) memory devices, and memory devices utilizing such structures.

2. Description of Related Art

High density three-dimensional (3D) memory devices include stacked multiple planes of memory cells, and peripheral circuits. The peripheral circuits can include circuitry for example that controls the memory cells for program, erase and read operations. Metal layers or other conductive or semiconductive layers can electrically connect the peripheral circuits to the memory cells. Typically, the peripheral circuits are manufactured in CMOS (complementary metal-oxide-semiconductor) technology, while the stacked multiple planes of memory cells are manufactured in different technologies such as charge trapping memory technologies that requires process steps that are different from those used to form the peripheral circuits.

It is desirable to provide a technology for a three-dimensional (3D) memory device to facilitate integration of stacked multiple planes of memory cells with peripheral circuits of the three-dimensional (3D) memory device.

SUMMARY

A technology for integrating stacked multiple planes of memory cells with peripheral circuits in three-dimensional memory devices is provided. An integrated circuit device in accordance with the technology includes a substrate including a first region and a second region. A pit is formed in the first region. A stack of active layers alternating with insulating layers is deposited in the pit.

The stack includes a particular insulating layer. The particular insulating layer has a first thickness, where a sum of the first thickness, thickness of active layers, and thicknesses of other insulating layers in the stack is essentially equal to a depth of the pit.

The first thickness is different than the thicknesses of the other insulating layers in the stack by an amount within a range of process variations for the depth of the pit, for the thicknesses of the active layers, and for the thicknesses of other insulating layers. The device includes a planarized surface over the first and second regions, where an uppermost one of the active layers has a top surface below the planarized surface.

A method in accordance with the technology includes etching a substrate to form a pit, where the pit has a target depth below a top surface of the substrate, and measuring a depth of the etched pit. The method includes depositing a stack of active layers alternating with insulating layers on the substrate at least in the etched pit, where the stack has at least one insulating layer having a thickness based on a difference between the target depth and the measured depth of the etched pit. The method includes applying a planarizing process to provide a planarized surface.

Other aspects and advantages of the present invention can be seen on review of the drawings, the detailed description and the claims, which follow.

DETAILED DESCRIPTION

A detailed description of embodiments of the present invention is provided with reference to the FIGS. 1-18.

Figure 1:
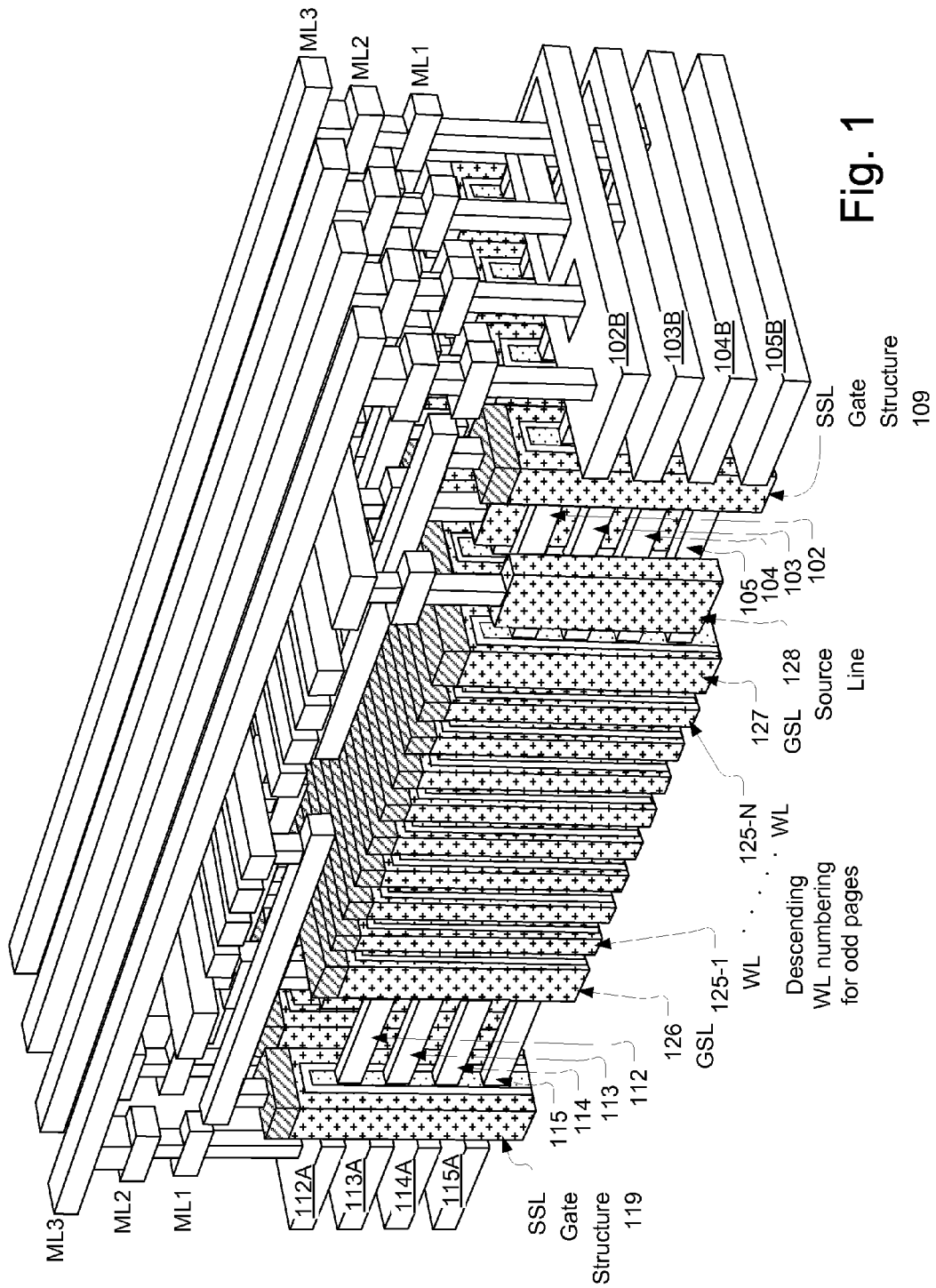
FIG. 1 is a perspective illustration of a three-dimensional (3D) NAND-flash memory device.

FIG. 1 is a perspective illustration of a three-dimensional (3D) NAND-flash memory device. The device illustrated in FIG. 1 includes stacks of active lines alternating with insulating lines. Insulating material is removed from the drawing to expose additional structure. For example, insulating lines are removed between the semiconductor lines, in the stacks, and are removed between the stacks of semiconductor lines. This structure is described herein in some detail, as an example of a three-dimensional (3D) memory array which can be manufactured in a recessed area, or pit, on a semiconductor substrate, in combination with peripheral circuits on the substrate outside of the pit. Other multilayer circuit structures can also be formed using the technology described herein.

In the example shown in FIG. 1, a multilayer array is formed on an insulating layer, and includes a plurality of word lines 125-1, . . . , 125-N conformal with the plurality of stacks. The plurality of stacks includes semiconductor lines 112, 113, 114, and 115 in multiple planes. Semiconductor lines in the same plane are electrically coupled together by bit line structures (e.g. 102B).

Bit line structures 112A, 113A, 114A, and 115A terminate semiconductor lines, such as semiconductor lines 112, 113, 114, and 115. As illustrated, these bit line structures 112A, 113A, 114A, and 115A are electrically connected to different bit lines for connection to decoding circuitry to select planes within the array. These bit line structures 112A, 113A, 114A, and 115A can be patterned at the same time that the plurality of stacks is defined.

Bit line structures 102B, 103B, 104B, and 105B terminate semiconductor lines, such as semiconductor lines 102, 103, 104, and 105. As illustrated, these bit line structures 102B, 103B, 104B, and 105B are electrically connected to different bit lines for connection to decoding circuitry to select planes within the array. These bit line structures 102B, 103B, 104B, and 105B can be patterned at the same time that the plurality of stacks is defined.

Any given stack of semiconductor lines is coupled to either the bit line structures 112A, 113A, 114A, and 115A, or the bit line structures 102B, 103B, 104B, and 105B, but not both. A stack of semiconductor bit lines has one of the two opposite orientations of bit line end-to-source line end orientation, or source line end-to-bit line end orientation. For example, the stack of semiconductor lines 112, 113, 114, and 115 has bit line end-to-source line end orientation; and the stack of semiconductor lines 102, 103, 104, and 105 has source line end-to-bit line end orientation.

The stack of semiconductor lines 112, 113, 114, and 115 is terminated at one end by the bit line structures 112A, 113A, 114A, and 115A, passes through SSL gate structure 119, ground select line GSL 126, word lines 125-1 WL through 125-N WL, ground select line GSL 127, and is terminated at the other end by source line 128. The stack of semiconductor lines 112, 113, 114, and 115 does not reach the bit line structures 102B, 103B, 104B, and 105B.

The stack of semiconductor lines 102, 103, 104, and 105 is terminated at one end by the bit line structures 102B, 103B, 104B, and 105B, passes through SSL gate structure 109, ground select line GSL 127, word lines 125-N WL through 125-1 WL, ground select line GSL 126, and is terminated at the other end by a source line (obscured by other parts of the figure). The stack of semiconductor lines 102, 103, 104, and 105 does not reach the bit line structures 112A, 113A, 114A, and 115A.

A layer of memory material is disposed in interface regions at cross-points between surfaces of the semiconductor lines 112-115 and 102-105 and the plurality of word lines 125-1 through 125-n. Ground select lines GSL 126 and GSL 127 are conformal with the plurality of stacks, similar to the word lines.

Every stack of semiconductor lines is terminated at one end by bit line structures and at the other end by a source line. For example, the stack of semiconductor lines 112, 113, 114, and 115 is terminated at one end by bit line structures 112A, 113A, 114A, and 115A, and terminated on the other end by a source line 128. At the near end of the figure, every other stack of semiconductor lines is terminated by the bit line structures 102B, 103B, 104B, and 105B, and every other stack of semiconductor lines is terminated by a separate source line. At the far end of the figure, every other stack of semiconductor lines is terminated by the bit line structures 112A, 113A, 114A, and 115A, and every other stack of semiconductor lines is terminated by a separate source line.

Bit lines and string select lines are formed at the metals layers ML1, ML2, and ML3. Bit lines are coupled to a plane decoder (not shown). String select lines are coupled to a string select line decoder (not shown).

The ground select lines GSL 126 and 127 can be patterned during the same step that the word lines 125-1 through 125-n are defined. Ground select devices are formed at cross-points between surfaces of the plurality of stacks and ground select lines GSL 126 and 127. The SSL gate structures 119 and 109 can be patterned during the same step that the word lines 125-1 through 125-n are defined. String select devices are formed at cross-points between surfaces of the plurality of stacks and string select (SSL) gate structures 119 and 109. These devices are coupled to decoding circuitry for selecting the strings within particular stacks in the array.

Figure 2:
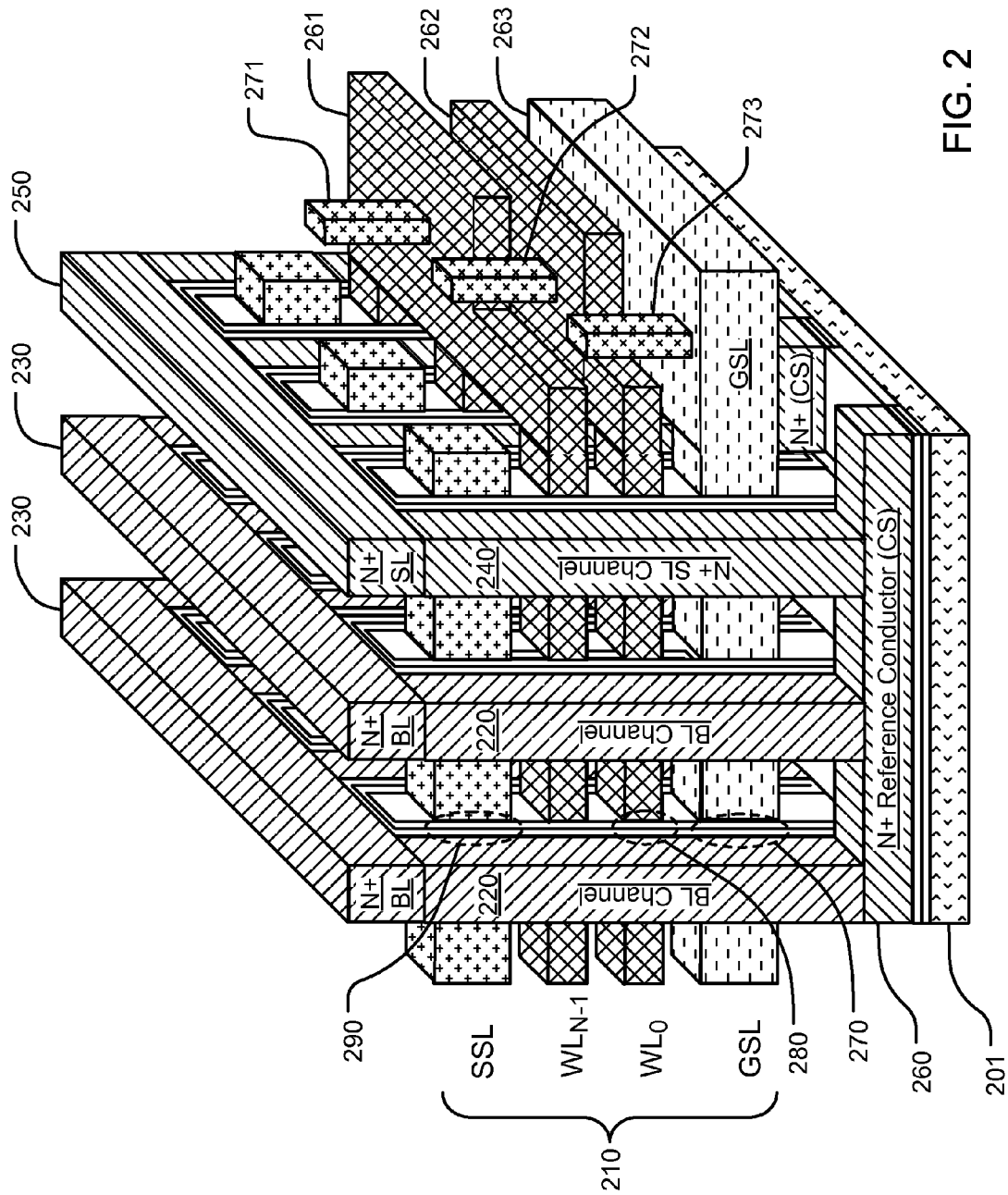
FIG. 2 is a perspective illustration of an alternative three-dimensional (3D) NAND-flash memory device.

FIG. 2 is a perspective illustration of an alternative three-dimensional (3D) NAND-flash memory device. The memory device includes an array of NAND strings of memory cells, and can be a double-gate vertical channel memory array (DGVC). The memory device includes an integrated circuit substrate 201, and a plurality of stacks of conductive strips alternating with insulating material. The stacks include at least a bottom plane of conductive strips (GSL), a plurality of intermediate planes of conductive strips (WLs), and a top plane of conductive strips (SSLs). For example, a stack 210 includes a bottom plane of conductive strips (GSL), a plurality of intermediate planes of conductive strips (WLs) ranging from $WL_0$ to $WL_{N-1}$, and a top plane of conductive strips (SSLs), where N can be 8, 16, 32, 64 and so on. The insulating material is removed from the drawing to expose additional structure. For example, the insulating material is removed between the conductive strips in the stacks, and is removed between the stacks of conductive strips.

In the example shown in FIG. 2, a plurality of bit line structures are arranged orthogonally over, and have surfaces conformal with, the plurality of stacks, including inter-stack semiconductor body elements 220 between the stacks and linking elements 230 over the stacks connecting the semiconductor body elements 220.

The memory device includes memory elements in interface regions at cross-points 280 between side surfaces of the conductive strips in the plurality of intermediate planes (WLs) in the stacks and the inter-stack semiconductor body elements 220 of the plurality of bit line structures.

A reference conductor 260 is disposed between the bottom plane (GSL) of conductive strips and the integrated circuit substrate 201. At least one reference line structure is arranged orthogonally over the plurality of stacks, including inter-stack semiconductor elements 240 between the stacks in electrical communication with the reference conductor 260, and linking elements 250 over the stacks 210 connecting the inter-stack semiconductor elements 240. The semiconductor elements 240 have a higher conductivity than the semiconductor body elements 220.

The memory device includes string select switches 290 at interface regions with the top plane of conductive strips, and reference select switches 270 at interface regions with the bottom plane (GSL) of conductive strips.

In the example shown in FIG. 2, the memory device can further include decoding circuitry coupled to the conductive strips in the plurality of stacks. The decoding circuitry can include word line decoding circuits, and string selection line decoding circuits coupled to the top plane of conductive strips (SSLs) in the plurality of stacks. String selection lines in the top plane of conductive strips are independently coupled to and controlled by the string selection line decoding circuits.

Conductive strips in the intermediate planes (WLs), and conductive strips in the bottom plane (GSL) are connected together to reduce decoder areas and consequently an overall size of the memory device. Conductive strips in the top plane (SSL) are individually decoded to allow correct bit line decoding.

The memory device can include linking elements, such as linking elements 261 and 262, connecting sets of word lines in the intermediate planes (WL), and interlayer connectors, such as interlayer connectors 271 and 272, coupled to landing areas in the linking elements 261 and 262, and to the word line decoding circuits (not shown). The landing areas are at interface regions between bottom surfaces of the interlayer connectors and top surfaces of the linking elements.

In the example shown in FIG. 2, interlayer connectors (e.g. 271 and 272) for sets of word lines at multiple layers in the plurality of intermediate planes are arranged in a staircase structure, and are connected to landing areas at two different layers in the plurality of intermediate planes. The staircase structure can be formed in a vertical contact region (e.g. 314 in FIG. 3) near the boundary of a memory cell region (e.g. 312 in FIG. 3) for the array of memory cells and a peripheral region (e.g. 318 in FIG. 3) for components of peripheral circuits. The vertical contact region can include linking elements 261 and 262, and interlayer connectors 271 and 272.

The memory device can include ground selection line decoding circuits coupled to the at least one bottom plane (GSL) of conductive strips in the plurality of stacks. The memory device can include linking elements, such as a linking element 263, connecting sets of ground selection lines in the bottom plane (GSL) of conductive strips, and interlayer connectors, such as an interlayer connector 273, coupled to landing areas in the linking elements, and to the ground selection line decoding circuits (not shown). The landing areas are at interface regions between bottom surfaces of the interlayer connectors, such as an interlayer connector 273, and top surfaces of the linking elements, such as a linking element 263. The vertical contact region (e.g. 314 in FIG. 3) can also include a linking element 263, and an interlayer connectors 273.

In the example shown in FIG. 2, the memory device includes a first overlying conductive layer (not shown) connected to the plurality of bit line structures, including a plurality of global bit lines coupled to sensing circuits. The memory device also includes a second overlying conductive layer (not shown) connected to the at least one reference conductor structure, coupled to a reference voltage source.

Three-dimensional memory (3D) devices, such as the ones illustrated by FIG. 1 and FIG. 2, as well as other structures of three-dimensional (3D) memory devices involving stacks of active layers alternating with insulating layers, include components of peripheral circuits in addition to stacks of active lines alternating with insulating lines described herein. Components of peripheral circuits can be manufactured on a planar surface of a substrate of an integrated circuit device to control function of the device. The stacks can be manufactured in a pit in the substrate below the planar surface. A depth of the pit is determined before deposition of any of the active lines and the insulating lines in the stacks in the pit. But due to process variation in etching the pit, the actual depth of the pit is not known until after the pit is etched. Also, due to process variation in depositing the active lines and the insulating lines, the actual thickness of the stacks is not known until after the deposition. In integration of the stacks with the components of the peripheral circuits, a planarization process can take place over the stacks and on a peripheral region in the substrate for the components of the peripheral circuits after the deposition. It is a challenge to ensure that, in presence of process variation, the active lines in the stacks are protected during the planarization process.

The structures of FIGS. 1 and 2 include sets of active layers in the stack that are have dimensions critical to uniformity of memory cells in the stacks. In the structure of FIG. 1, the active layers including the semiconductor lines 112, 113, 114, and 115 provide the semiconductor body regions for memory cells in horizontal NAND strings along the lines, and the thicknesses of those lines are critical to the channel width of the memory cells. In the structure of FIG. 2, the active layers including the word lines $WL_{N-1}$ and $WL_0$, provide the word lines for memory cells in vertical NAND strings along the inter-stack semiconductor body elements 220, and the thicknesses of those word lines are critical to the channel length of the memory cells. Thus, the active layers that include critical thickness features can be configured in the manufacturing to have identical or close to identical thicknesses, to improve uniformity of the critical characteristics of memory cells across the array. On the other hand, the thickness of the GSL line in FIG. 2 can be critical to the channel length of a ground select transistor in the NAND string. Also, insulating layers in the stacks between the active layers isolate the active layers, and thus may have minimum acceptable thicknesses in order to act as reliable insulators, and those minimum acceptable thicknesses can be specified during manufacturing for each layer. However, some of the insulating layers can have thicknesses larger than the specified thicknesses, without having a substantial impact on memory cell performance. As the number of active and insulating layer in the stack increases, the height of the stack can become a manufacturing problem, and it is desirable to maintain the overall height as small as practical.

Figure 3:
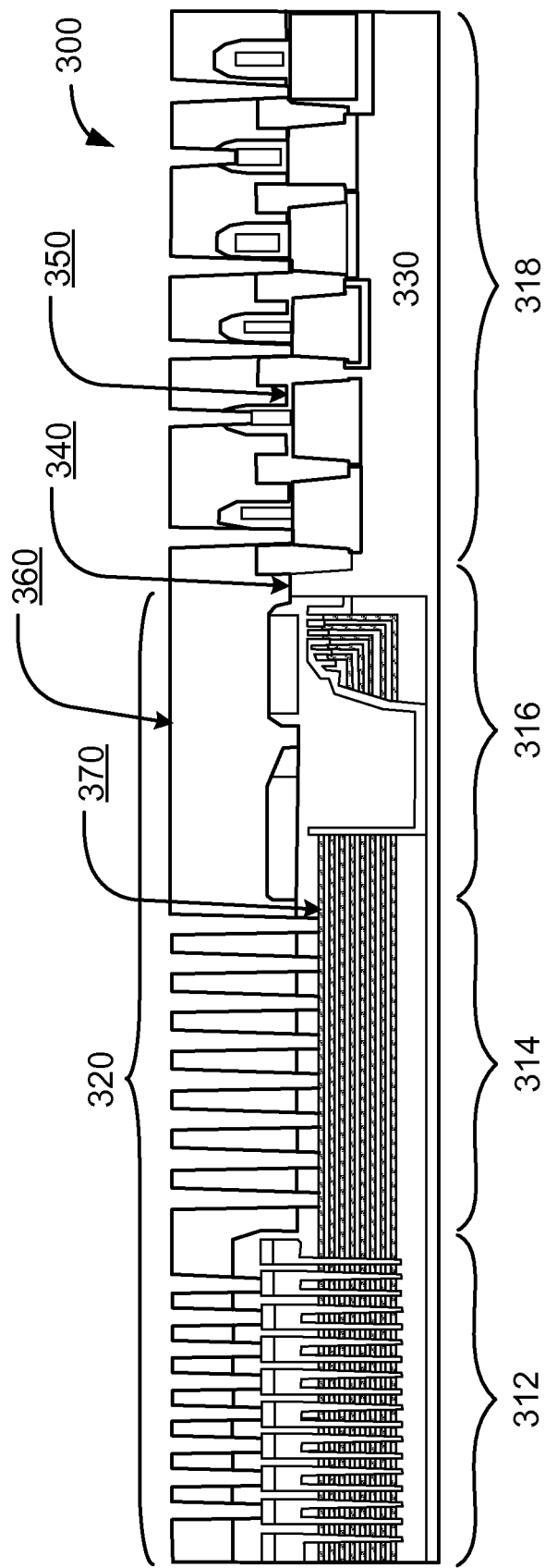
FIG. 3 is a simplified cross-sectional view of one example of three-dimensional (3D) NAND-flash memory device.

FIG. 3 is a simplified cross-sectional view of one example of three-dimensional (3D) memory device 300 including a memory cell region 312, a vertical contact region 314, an isolation region 316 and a peripheral region 318. The memory cell region 312 includes a stack of active layers alternating with insulating layers, where the active layers can include patterned semiconductor or conductive materials used as bit line or word lines in a memory, and the insulating layers can include dielectric materials. The active layers and the insulating layers are disposed in a recessed area, or a pit, on the substrate. The vertical contact region 314 includes linking elements that connect bit lines or word lines etched from the active layers in the memory cell region 312 to overlying metal layers. The isolation region 316 electrically insulates the memory cell region 312 and the vertical contact region 314 from the peripheral region 318. The peripheral region 318 includes components of peripheral circuits including decoding circuitry, connected to circuit elements in the memory cell region 312 and the vertical contact region 314 via the overlying metal layers.

Process variation in stacking active layers alternating with insulating layers in the memory cell region 312 and the vertical contact region 314 can be addressed as described herein, to facilitate integration of the memory cell region with the components of the peripheral circuits of the integrated circuit device in the peripheral region 318. Device 300 is illustrated as an example of one type of integrated circuit device with which the present invention can be used; others are also possible. In the example shown in FIG. 3, a planarized surface can be formed at various levels over the memory cell region 312, the vertical contact region 314, the isolation region 316, and the peripheral region 318. In one embodiment, the planarized surface can be formed at a level 340 of a top surface of a substrate 330. In another embodiment, the planarized surface can be formed at a level 350 of a top surface of peripheral gates in the peripheral region 318. In yet another embodiment, the planarized surface can be formed at a level 360 of a bottom surface of a lowermost one of the overlying metal layers (not shown). The planarized surface can also be formed at a level between the level 340 and the level 350, or between the level 350 and the level 360. As described herein, as the number of active and insulating layer in the stack increases, the height of the stack can become a manufacturing problem. For example, because of process variations, the pit can be etched in the substrate with a depth less than a specified depth, and the stack can be manufactured with a height greater than a sum of combined specified thicknesses of active layers and insulating layers in the stack, such that if a planarization process takes place at the level 340 of the top surface of a substrate 330, an uppermost one of the active layers (e.g. 370) can be damaged by the planarization process. The present technology provides a method and a device to prevent damage to critical elements of the stack, such as the uppermost one of the active layers, when the number of active and insulating layer in the stack increases.

In the example shown in FIG. 3, the memory cell region 312, the vertical contact region 314, and the isolation region 316 are in a pit 320 in a substrate 330. The memory cell region 312 can include semiconductor lines 112-115 and 102-105, SSL gate structures 119 and 109, ground select lines GSL 126 and 127, word lines 125-1 WL through 125-N WL, ground select lines GSL 127 and 126, and source line 128, as illustrated in FIG. 1.

The vertical contact region 314 can include bit line structures 102B, 103B, 104B, and 105B, and bit line structures 112A, 113A, 114A, and 115A, connected to bit lines at metals layers ML1, ML2, and ML3, as illustrated in FIG. 1. In reference to the memory device illustrated in FIG. 2, the vertical contact region 314 can include linking elements 261 and 262 that connect sets of word lines in the intermediate planes (WL), and interlayer connectors 271 and 272 that are coupled to landing areas in the linking elements 261 and 262, and to the word line decoding circuits (not shown). In reference to the memory device illustrated in FIG. 2, the vertical contact region 314 can also include the linking element 263 that connect sets of ground selection lines in the bottom plane (GSL) of conductive strips, and interlayer connectors 273 that are coupled to landing areas in the linking element 263, and to the ground selection line decoding circuits (not shown). The isolation region 316 separates the memory cell region 312 and the vertical contact region 314 from the peripheral region 318.

Components of peripheral circuits in the peripheral region 318 can include the decoding circuitry such as described for the memory devices illustrated in FIG. 1 and FIG. 2. For instance, the decoding circuitry as described for the memory device illustrated in FIG. 2 can include word line decoding circuits, string selection line decoding circuits, and the ground selection line decoding circuits. Components of the peripheral circuits can also include controllers, voltage generators, address generators, command decoders, gates, patterned metal layers, and vias connecting patterned metal layers with other components. The components of the peripheral circuits can be manufactured with CMOS (complementary metal-oxide-semiconductor) technology.

A planarized surface is formed over the memory cell region 312, the vertical contact region 314, the isolation region 316, and the peripheral region 318. Patterned metal layers are formed over the planarized surface. In reference to the memory device illustrated in FIG. 1, the patterned metal layers can include metals layers ML1, ML2, and ML3. In reference to the memory device illustrated in FIG. 2, the patterned metal layers can include the first overlying conductive layer (not shown) connected to the plurality of bit line structures, and the second overlying conductive layer (not shown) connected to the reference conductor structure. The patterned metal layers can couple the components of the peripheral circuits in the peripheral region 318 to the memory cells in the memory cell region 312. The patterned metal layers can couple the components of the peripheral circuits in the peripheral region 318 to bit line structures 102B, 103B, 104B, and 105B, 112A, 113A, 114A, and 115A (FIG. 1) in the vertical contact region 314. The patterned metal layers can couple the components of the peripheral circuits in the peripheral region 318 to interlayer connectors 271, 272 and 273 (FIG. 2) in the vertical contact region 314.

Figure 4:
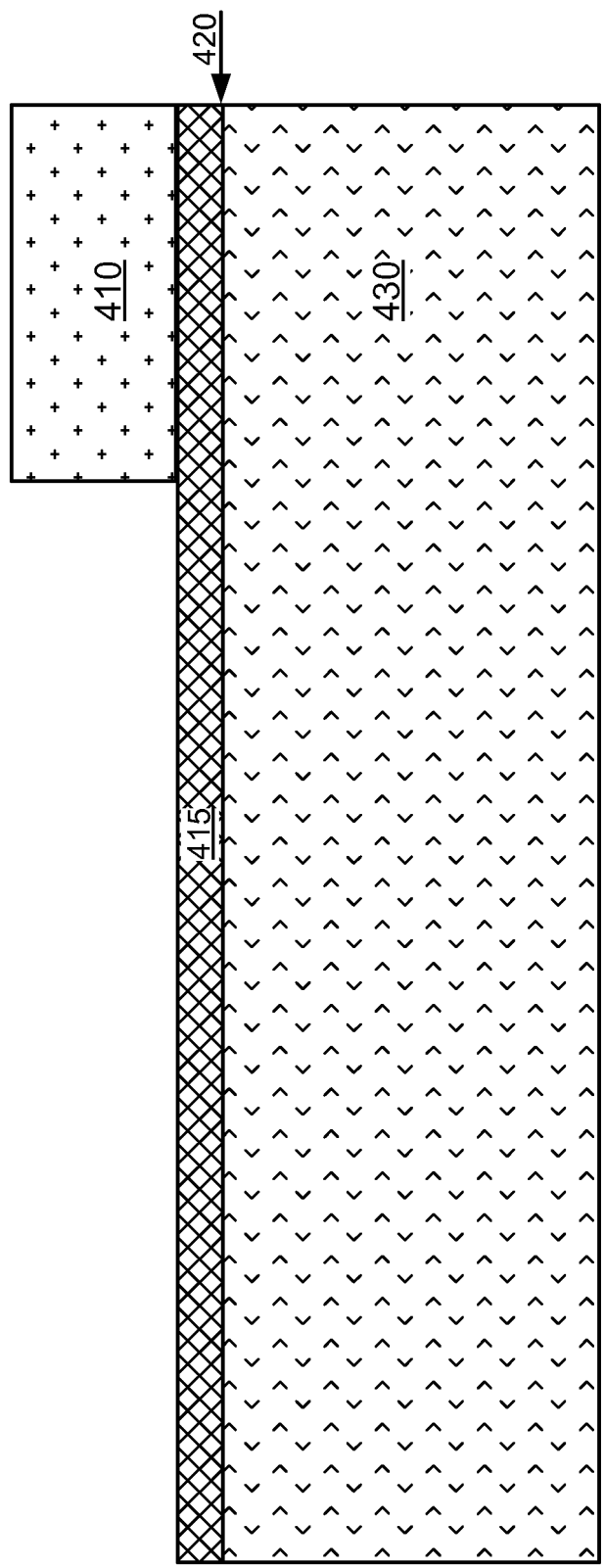
FIGS. 4-7 illustrate stages in a manufacturing method for a device on an integrated circuit, in accordance with a first embodiment.

FIGS. 4-7 illustrate stages in a method for manufacturing a device on an integrated circuit, in accordance with a first embodiment. FIG. 4 illustrates a substrate 430 having a top surface 420 in the integrated circuit device. A sacrificial layer 415 is formed on the substrate 430, and an etch mask 410 is formed over the substrate 430 to select an area for etching a pit with a target depth in the substrate 430. The target depth is specified in advance of manufacturing and stored in a manufacturing control system. The target depth can be calculated as greater than, lower than, or equal to a sum of target thicknesses of a stack of active layers and insulating layers to be deposited in the pit. Target thicknesses of active layers and insulating layers in the stack can also be specified in advance of manufacturing and stored in a manufacturing control system.

Figure 5:
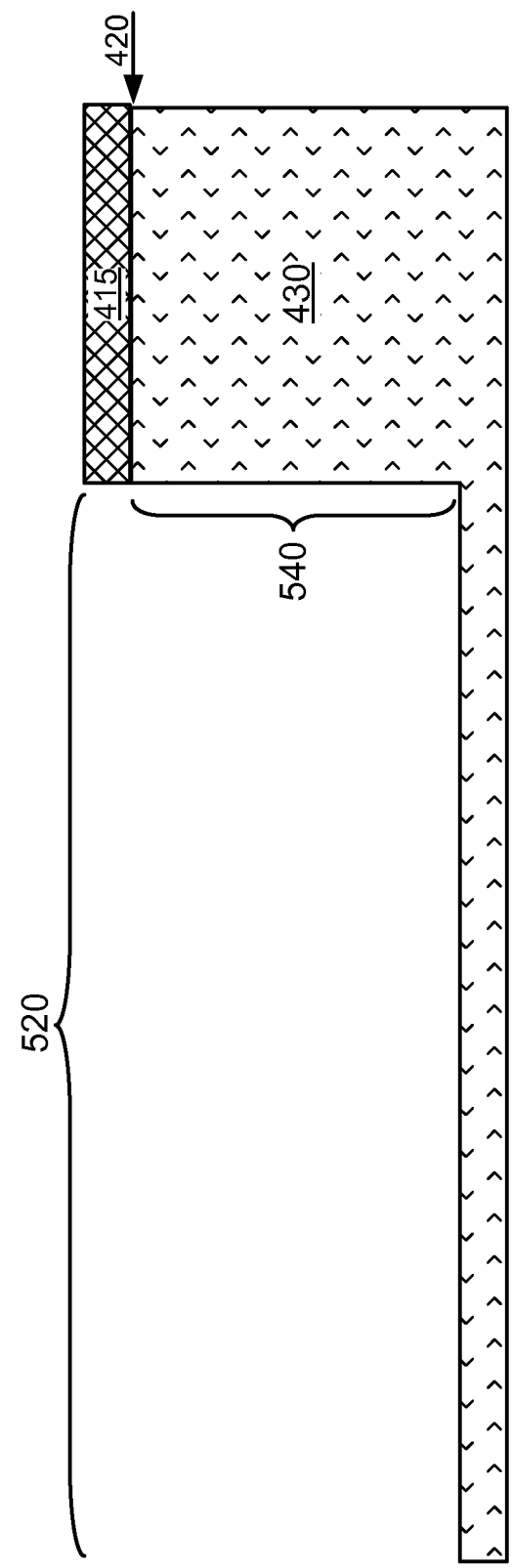

As illustrated in FIG. 5, a pit 520 is etched in the substrate 430 using the etch mask 410. After the etching, an actual depth of the pit 520 is measured to produce a measured depth 540. The actual depth of the pit can be measured by an alpha stepper, a precision measurement instrument used for determining and analyzing thin step heights in the manufacture of integrated circuits. An alpha stepper can have sub-angstrom resolution, where an angstrom is equal to 0.1 nanometer. Due to process variation, there may be a difference between the target depth and the measured depth 540 of the pit 520. The process variation may be among chips on a wafer, or among chips on different wafers. The measured depth 540 can be within a range of the target depth. In some example processes, the measured depth 540 can be within +/−5% of the target depth. Said another way, in some example processes, if the target depth is 600 nanometers, the measured depth 540 can be between 570 nanometers and 630 nanometers.

Figure 6:
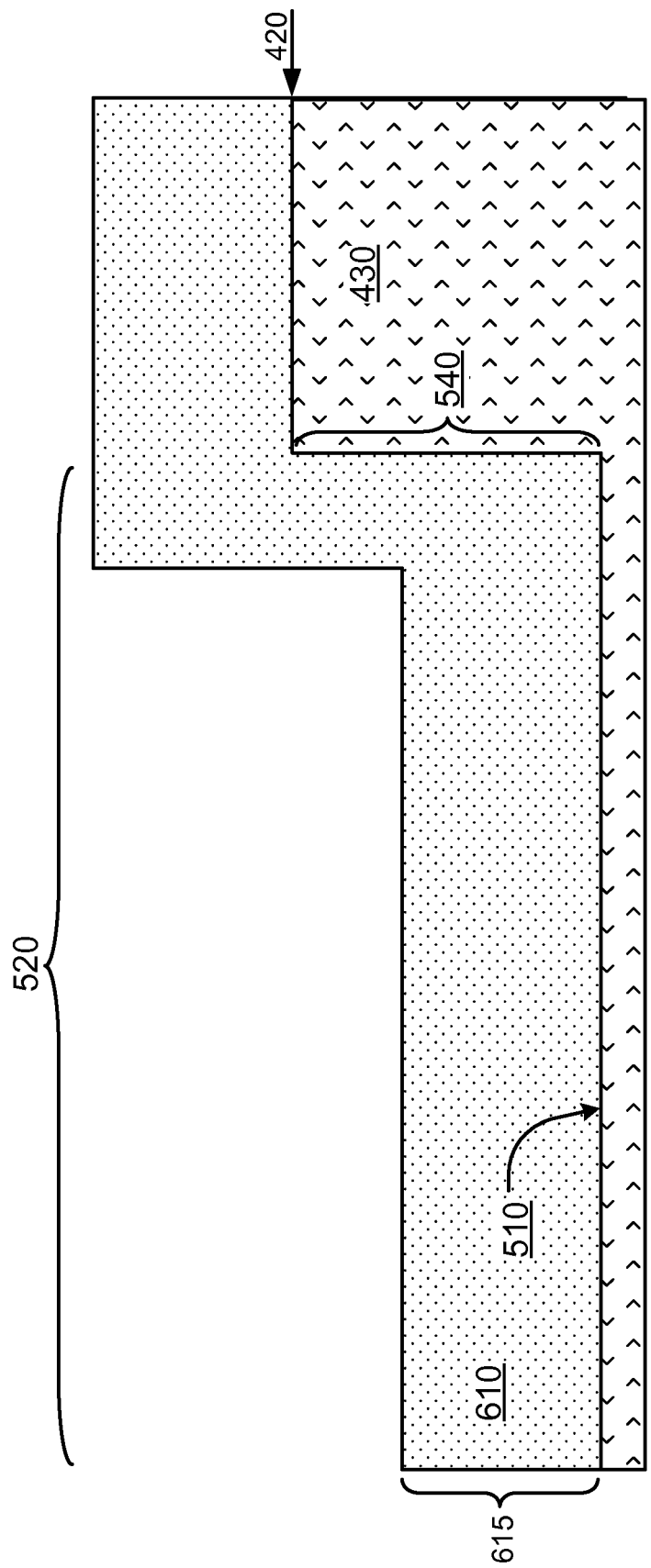

As illustrated in FIG. 6, the at least one insulating layer includes a bottom insulating layer 610 deposited on a bottom 510 in the pit 520 and on the substrate 430, where the sacrificial layer 415 (FIG. 5) is removed prior to deposition of the bottom insulating layer. The bottom insulating layer 610 has a target thickness 615 based on a difference between the target depth and the measured depth 540 of the pit 520.

As described herein, the target depth can be calculated as greater than or equal to a sum of target thicknesses of a stack of active layers and insulating layers to be deposited in the pit, such that an uppermost one of the active layers in the stack has a top surface below the top surface 420 of the substrate 430 after deposition of the stack. However, the measured depth 540 of the pit 520 may be less than the target depth of the pit 520. To compensate for the difference between the target depth and the measured depth 540, the target thickness of the bottom insulating layer 610 can be adjusted by the difference, such that the uppermost one of the active layer has a top surface below the top surface 420 of the substrate 430 after deposition of the stack.

Figure 7:
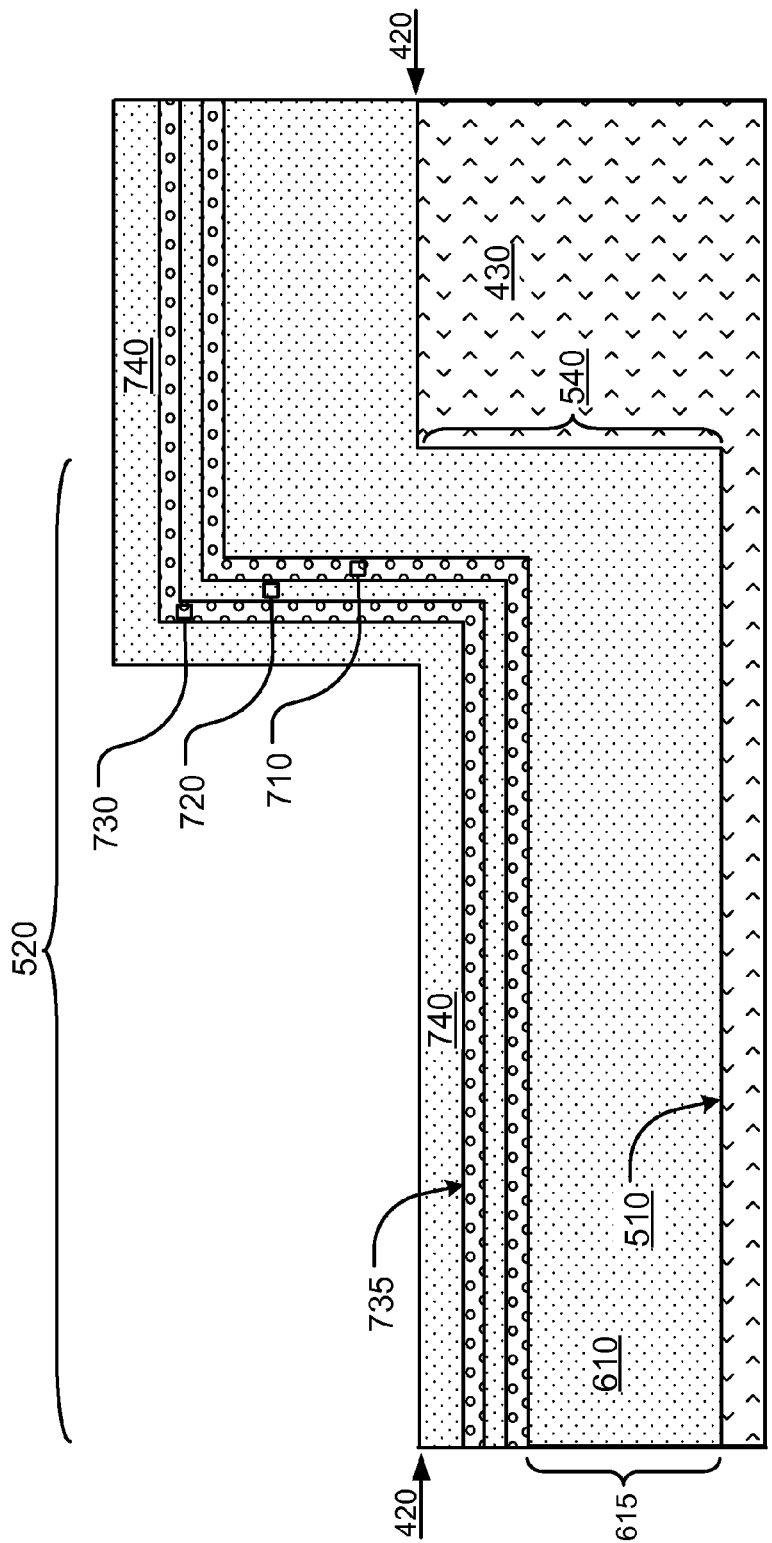

FIG. 7 illustrates active layers 710 and 730 alternating with the bottom insulating layer 610, an intermediate insulating layer 720, and a top insulating layer 740 in the stack deposited in the pit 520 and on the substrate 430. Although only two active layers are shown in the stack, the stack can include more active layers, such as 8, 16, or 32 layers with alternating insulating layers. The uppermost active layer 730 has a top surface 735 below the top surface 420 of the substrate 430, such that when a planarization process takes place at the level of the top surface 420 of the substrate 430, the uppermost active layer 730 is protected, and the stack can be flush with the top surface 420 of the substrate 430.

Insulating layers in the stack can be the same or different as the other layers. Representative insulating materials that can be used include an oxide, nitride, oxynitride, silicate, or others. Low insulating constant materials having an insulating constant smaller than that of silicon dioxide, such as $SiCHO_x$, can be used. High insulating constant (high-k) materials having an insulating constant greater than that of silicon dioxide, such as $HfO_x$, HfON, $AlO_x$, $RuO_x$, $TiO_x$, can be used also.

Conductor or semiconductor layers in the stack can be the same or different as the other layers. Representative materials that can be used include electrically conductive semiconductors including heavily doped polysilicon (using dopants such as As, P, B), silicides including TiSi, CoSi, oxide semiconductors, including InZnO, InGaZnO, and combinations of semiconductors and silicides. Conductive layers in the stack can also be a metal, a conductive compound, or combinations of materials including Al, Cu, W, Ti, Co, Ni, TiN, TaN, TaAlN, and others.

Figure 8:
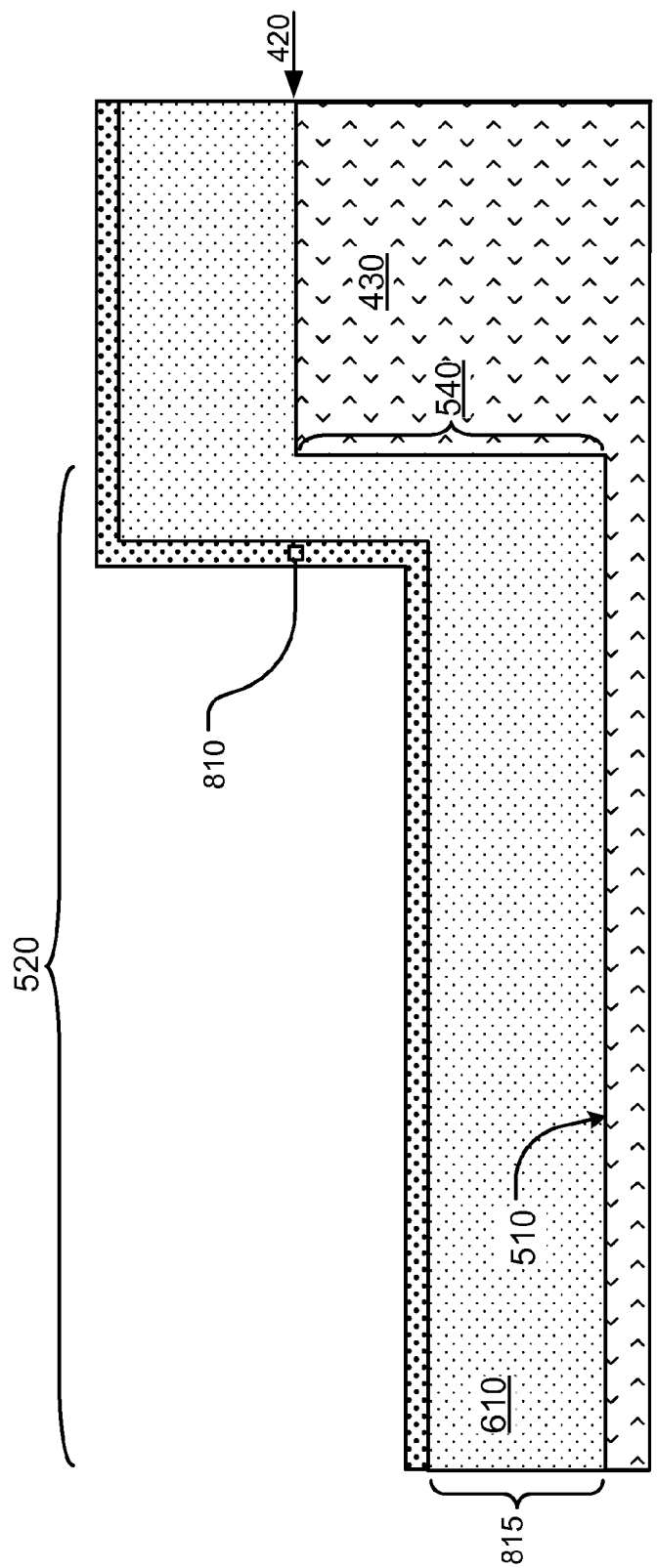
FIGS. 8-9 illustrate stages in a manufacturing method for a device on an integrated circuit, in accordance with a second embodiment.
Figure 9:
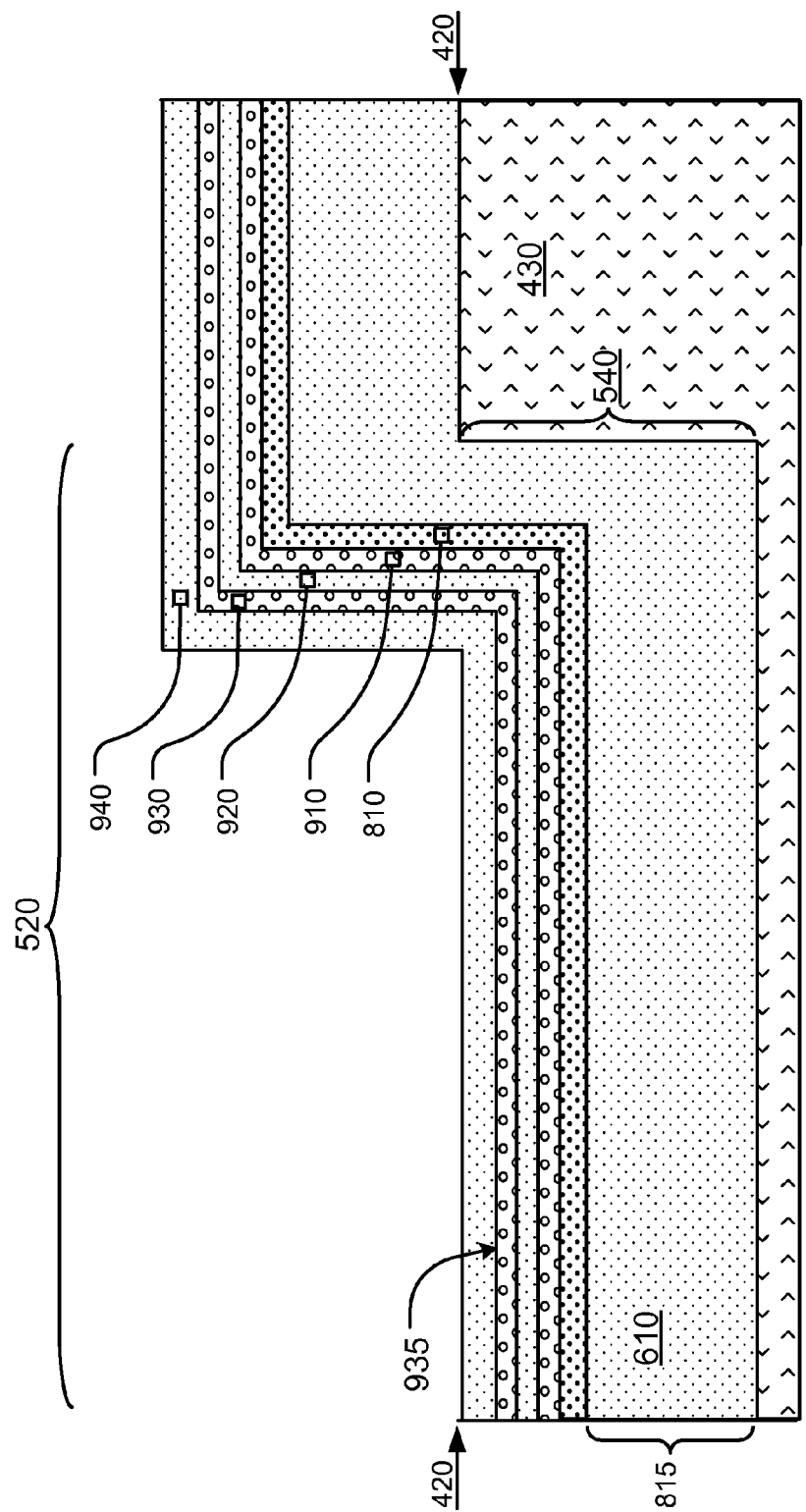

FIGS. 8-9 illustrate a method for manufacturing a device on an integrated circuit, in accordance with a second embodiment. FIG. 8 continues with the process illustrated in FIG. 6 for the first embodiment, where the pit 520 is etched in the substrate 430, and a bottom insulating layer 610 is deposited on a bottom 510 in the pit 520 and on the substrate 430. In reference to FIG. 8, an actual thickness of the bottom insulating layer 610 is measured to produce a measured thickness 815. The actual thickness of the bottom insulating layer 610 can be measured by a metrology system that can determine film thickness of layers of materials deposited in the manufacture of integrated circuits. One example of such a metrology system can be an "n and k" analyzer, where n is a refractive index and k is an extinction coefficient used in determining the film thickness. Representative "n and k" analyzers include models sold by n&k Technology, Inc., of San Jose, Calif., such as the n&k Olympian Metrology System.

Due to process variation, there may be a difference between the target thickness 615 and the measured thickness 815 of the bottom insulating layer 610. The process variation may be among chips on a wafer, or among chips on different wafers. The measured thickness 815 can be within a range of the target thickness 615. In some example processes, the measured thickness 815 can be within +/−5% of the target thickness 615. Said another way, in some example processes, if the target thickness 615 is 200 nanometers, the measured thickness 815 can be between 190 nanometers and 210 nanometers.

As illustrated in FIG. 8, a second insulating layer 810 is deposited over and in contact with the bottom insulating layer 610. The second insulating layer 810 has a second thickness based on the measured thickness 815 of the deposited bottom insulating layer 610 and the measured depth 540 of the pit 520. The second thickness of the second insulating layer 810 can be calculated such that an uppermost one of the active layers has a top surface below the top surface 420 of the substrate 430 after deposition of the stack.

As illustrated in FIG. 9, an uppermost active layer 930 and another active layer 910 alternating with the second insulating layer 810, an intermediate insulating layer 920, and a top insulating layer 940 are deposited in the pit 520 and on the substrate 430. Although only two active layers are shown in the stack, the stack can include more active layers, such as 8, 16, or 32 layers with alternating insulating layers. The uppermost active layer 930 has a top surface 935 below the top surface 420 of the substrate 430, such that when a planarization process takes place at the level of the top surface 420 of the substrate 430, the uppermost active layer 930 is protected, and the stack can be flush with the top surface 420 of the substrate 430.

Figure 10:
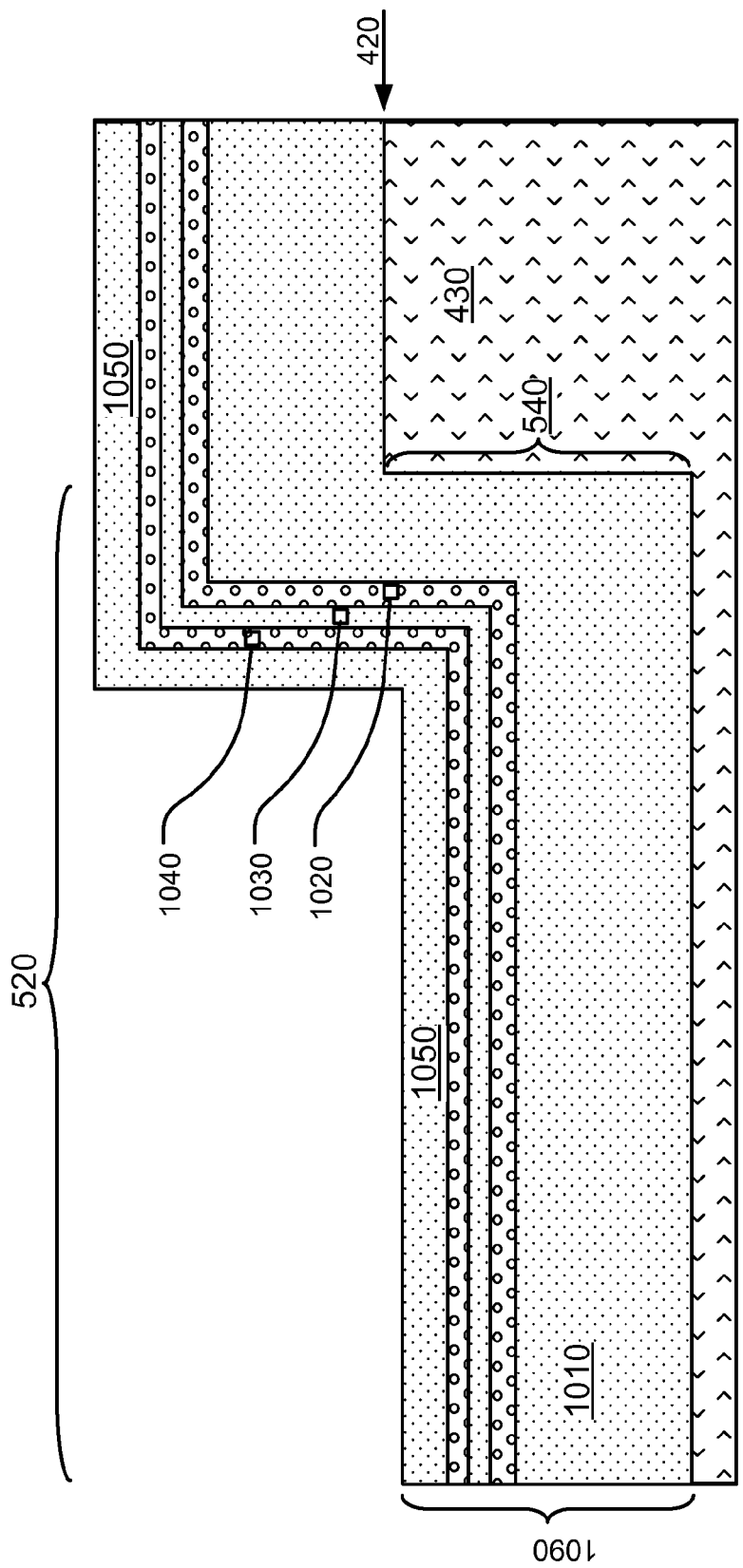
FIGS. 10-11 illustrate stages in a manufacturing method for a device on an integrated circuit, in accordance with a third embodiment.
Figure 11:
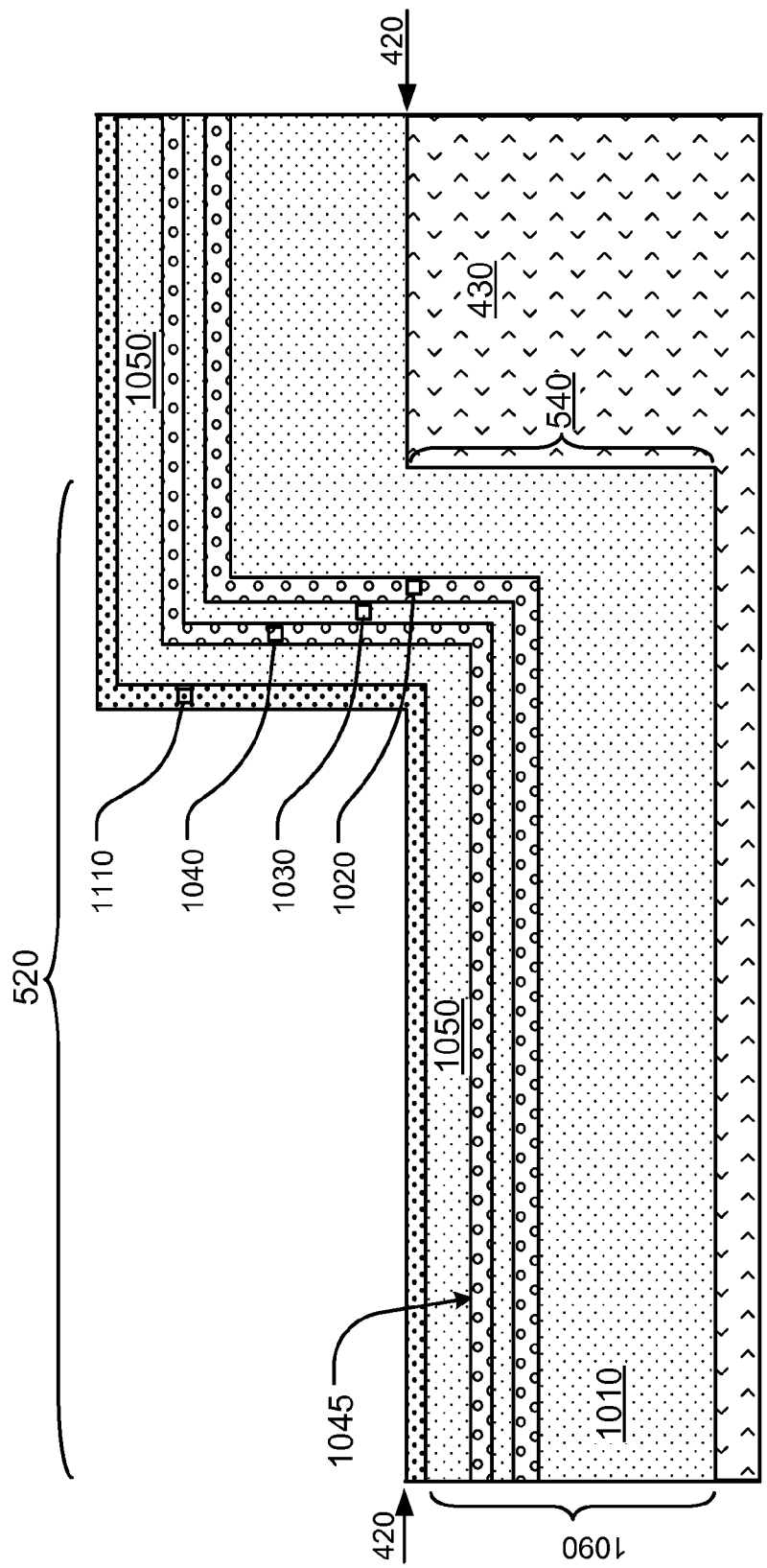

FIGS. 10-11 illustrate a method for manufacturing a device on an integrated circuit, in accordance with a third embodiment. FIG. 10 continues with the process illustrated in FIG. 5 for the first embodiment, where the pit 520 is etched in the substrate 430. In the third embodiment, the target depth of the stack is greater than the thickness of the stack of active layers alternating with insulating layers, such that an uppermost active layer 1040 has a top surface 1045 below the top surface 420 of the substrate 430. As illustrated in FIG. 10, a stack of active layers 1020 and 1040 alternating with insulating layers 1010, 1030 and 1050 in the stack is deposited in the pit 520 and on the substrate 430, where the sacrificial layer 415 (FIG. 5) is removed prior to deposition of the stack. Although only two active layers are shown in the stack, the stack can include more active layers, such as 8, 16, or 32 layers with alternating insulating layers. A thickness of the deposited stack is measured to produce a measured thickness 1090. The thickness of the deposited stack can be measured by a precision measurement instrument used for determining and analyzing thin step heights in the manufacture of integrated circuits. One example of such an instrument can be an alpha stepper that can have sub-angstrom resolution, where an angstrom is equal to 0.1 nanometer. Representative alpha stepper instruments include models sold by KLA-Tencor Corporation of Milpitas, Calif., such as the Alpha-Step IQ Surface Profiler.

As described herein, due to process variation, there may be a difference between the target thickness 615 and the measured thickness 815 of the bottom insulating layer 610 (FIGS. 6-8). Similarly, there may be a difference between a target thickness and a measured thickness of an active layer (e.g. 1020). In some example processes, the measured thickness of an active layer can be within +/−5% of the target thickness of the active layer. Said another way, in some example processes, if the target thickness of the active layer is 30 nanometers, the measured thickness of the active layer can be between 28.5 nanometers and 31.5 nanometers. Similarly, there can also be a difference between a target thickness and a measured thickness of an insulating layer (e.g. 1030) between two active layers (e.g. 1020 and 1040).

As illustrated in FIG. 11, since the target depth of the stack is greater than the thickness of the stack of active layers alternating with insulating layers, a top insulating layer 1110 is deposited over the stack to bring the stack to a level flush with the top surface 420 of the substrate 430. The top insulating layer 1110 has a thickness based on the measured thickness 1090 of the deposited stack and the measured depth 540 of the pit 520. For instance, the thickness of the top insulating layer 1110 can be calculated as the difference between the measured depth 540 of the pit 520 and the measured thickness 1090 of the stack, including actual thicknesses of active layers and insulating layers already deposited in the pit 520. When a planarization process takes place at the level of the top surface 420 of the substrate 430, the uppermost active layer 1040 is protected, and the stack can be flush with the top surface 420 of the substrate 430.

Figure 12A:
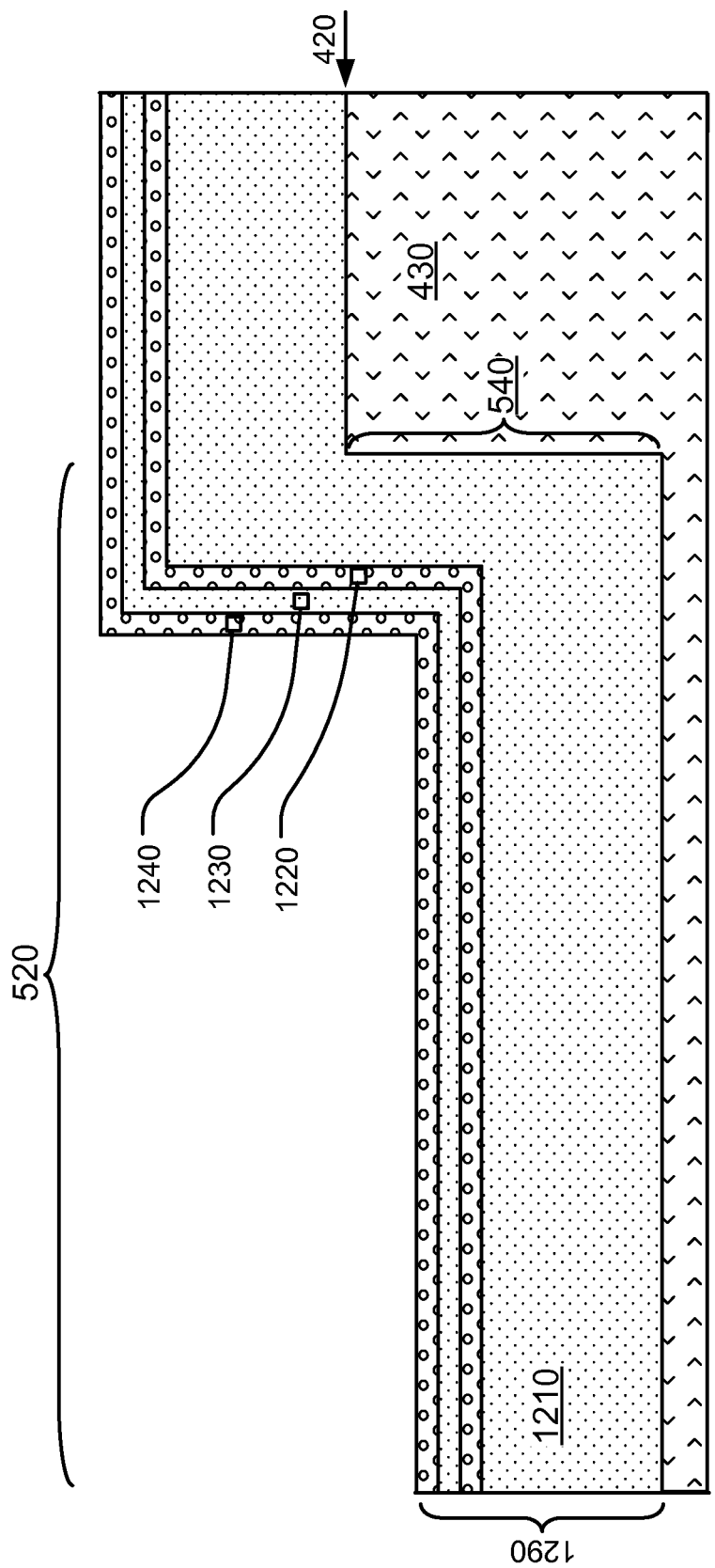
FIGS. 12A and 12B illustrate a method for manufacturing a device on an integrated circuit, in accordance with a fourth embodiment.
Figure 12B:
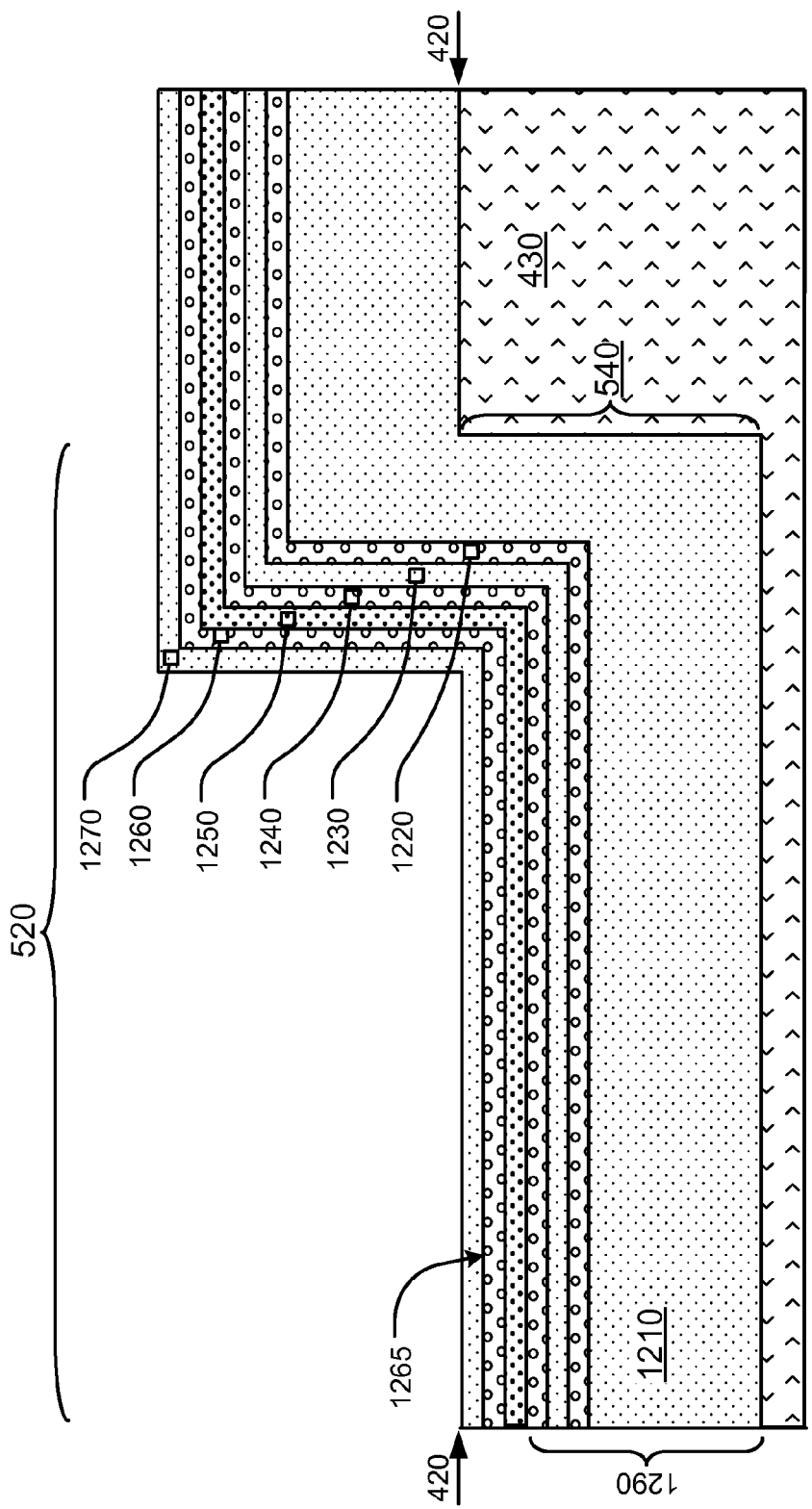

FIGS. 12A and 12B illustrate a method for manufacturing a device on an integrated circuit, in accordance with a fourth embodiment. FIG. 12A continues with the process illustrated in FIG. 5 for the first embodiment, where the pit 520 is etched in the substrate 430.

As illustrated in FIG. 12A, the stack includes a lower sub-stack including some of the active layers alternating with insulating layers in the stack. FIG. 12A illustrates a lower sub-stack including active layers 1220 and 1240 alternating with insulating layers 1210 and 1230 deposited in the pit 520 and on the substrate 430, where the sacrificial layer 415 (FIG. 5) is removed prior to deposition of the lower sub-stack. Although only two active layers are shown in the lower sub-stack, the lower sub-stack can include more active layers, such as 8, 16, or 32 layers with alternating insulating layers. A lower sub-stack thickness 1290 of the deposited active layers 1220 and 1240 and insulating layers 1210 and 1230 in the lower sub-stack stack is measured after deposition of the lower sub-stack.

As illustrated in FIG. 12B, an intermediate insulating layer 1250 is deposited over the lower sub-stack, and the stack includes an upper sub-stack including others of the active layers alternating with insulating layers in the stack. The intermediate insulating layer 1250 has a thickness based on the measured depth 540 of the pit 520 and the measured lower sub-stack thickness 1290, such that an uppermost active layer 1260 in the upper sub-stack has a top surface 1265 below the top surface 420 of the substrate 430. The upper sub-stack, including the uppermost active layer 1260 and an insulating layer 1270, is deposited over the intermediate insulating layer 1250. Thus the intermediate insulating layer is disposed in-between the lower sub-stack and the upper sub-stack. When a planarization process takes place at the level of the top surface 420 of the substrate 430, the uppermost active layer 1260 is protected, and the stack can be flush with the top surface 420 of the substrate 430.

Although FIGS. 12A and 12B illustrate only one intermediate insulating layer 1250, the fourth embodiment can include more than one intermediate insulating layers between a bottom insulating layer (e.g. 1210) and an uppermost active layer (e.g. 1260) to deposit thicker or thinner insulating layers than a target thickness that can be specified in advance of manufacturing and stored in a manufacturing control system.

Figure 13:
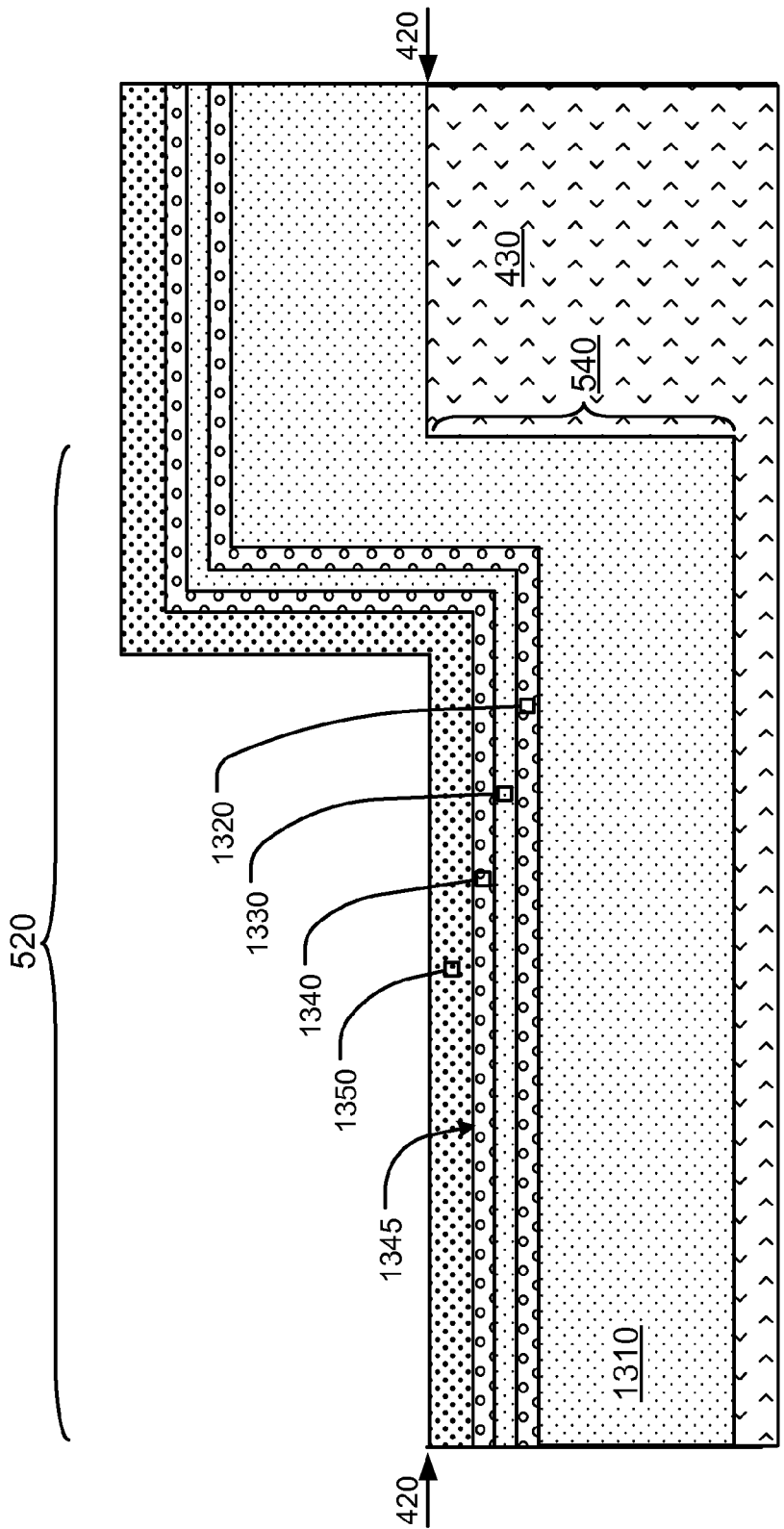
FIGS. 13-18 illustrate stages in an example of a manufacturing method for integrating a stack disposed in a pit in an integrated circuit device with peripheral circuits for the device.

FIGS. 13-18 illustrate a method for integrating a stack deposited in a pit in an integrated circuit device with the components of the peripheral circuits for the device. As illustrated in FIG. 13, a stack is deposited in the pit 520 and on the substrate 430.

The stack can be manufactured using one of the four embodiments described above. The stack includes active layers 1320 and 1340 alternating with a bottom insulating layer 1310, an intermediate insulating layer 1330, and a top insulating layer 1350. Although only two active layers are shown in the stack, the stack can include more active layers, such as 8, 16, or 32 layers with alternating insulating layers. An uppermost active layer 1340 has a top surface 1345 below the top surface 420 of the substrate 430, such that when a planarization process takes place at the level of the top surface 420 of the substrate 330, the active layer 1340 is protected, and the stack can be flush with the top surface 420 of the substrate 430.

The thickness of the top insulating layer 1350 can be calculated as the difference between the measured depth 540 of the pit 520 and a sum of the measured thicknesses of active layers (e.g. 1320, 1340) and insulating layers (e.g. 1310, 1330) already deposited in the pit 520. The material of the top insulating layer 1350 can include the same material as for other insulating layers (e.g. 1310, 1330) such as oxide, nitride, oxynitride, silicate, or others.

Figure 14:
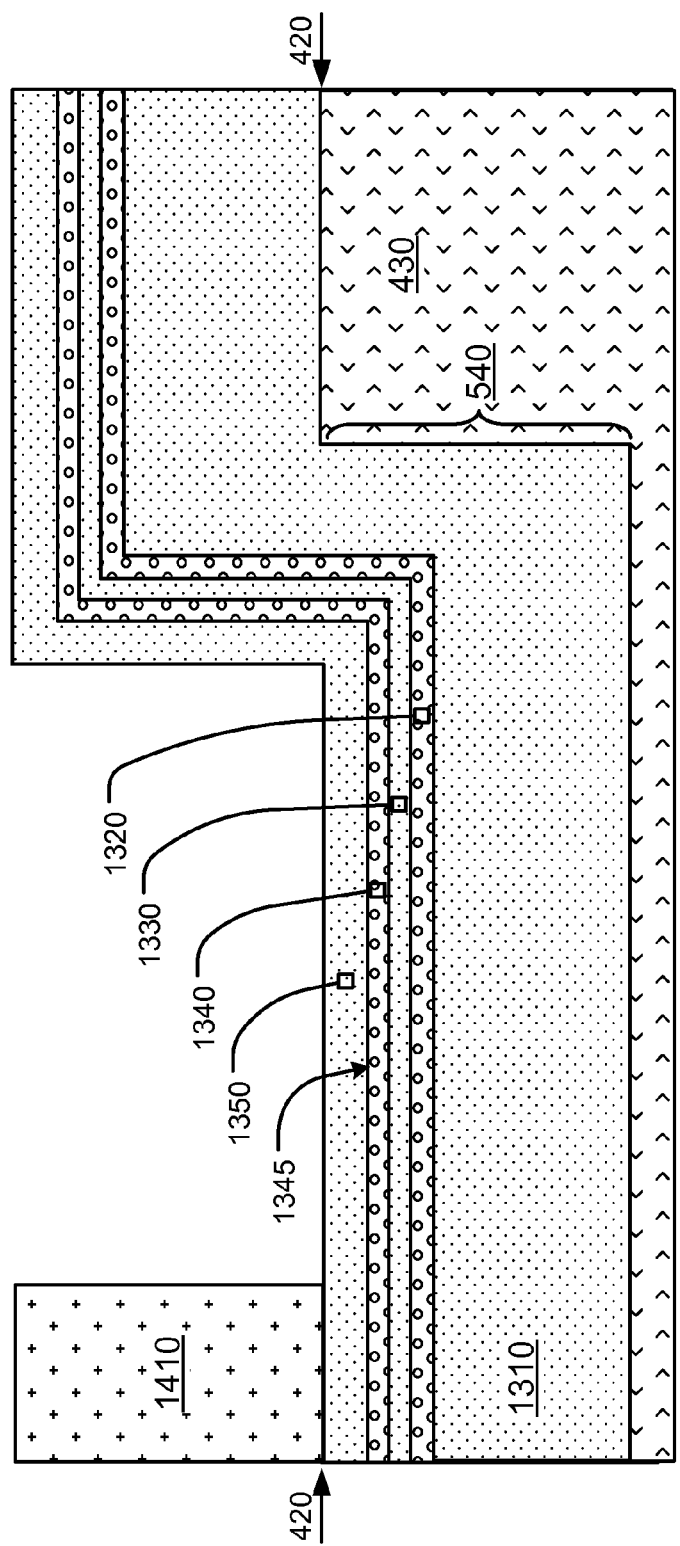

As illustrated in FIG. 14, an etch mask 1410 is formed over a portion of the stack to define a memory cell region.

Figure 15:
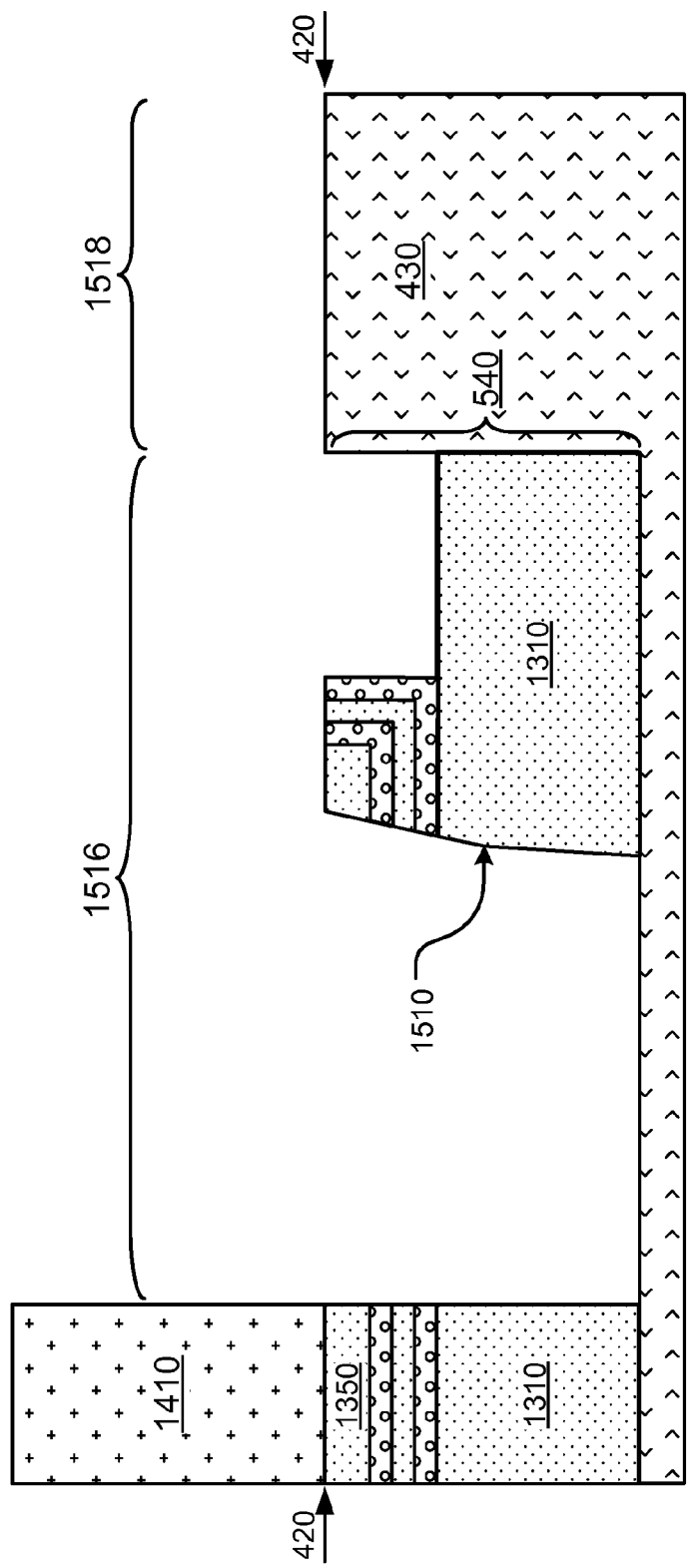

As illustrated in FIG. 15, the stack is then etched to form an isolation region 1516 that separates the memory cell region from a peripheral region 1518. Portions of the stack under the etch mask 1410 remain to be used in formation of a memory array that can include the memory cell region 312, and the vertical contact region 314 as illustrated in FIG. 3. The etching process leaves a residual of materials in the stack such that a wall of the isolation region (e.g. 1510) opposite the memory array is tilted towards the peripheral region and away from the memory array.

Figure 16:
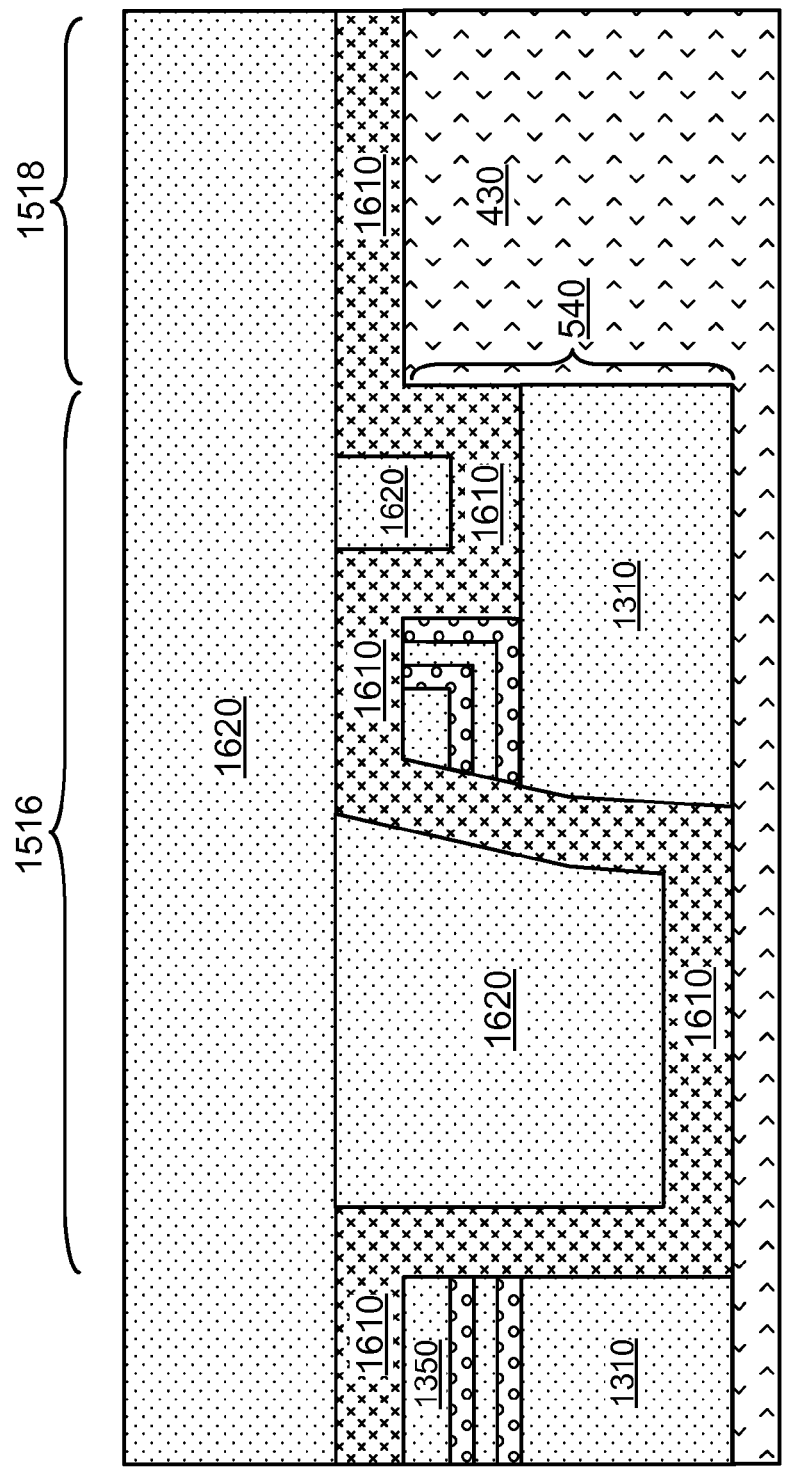
Figure 17:
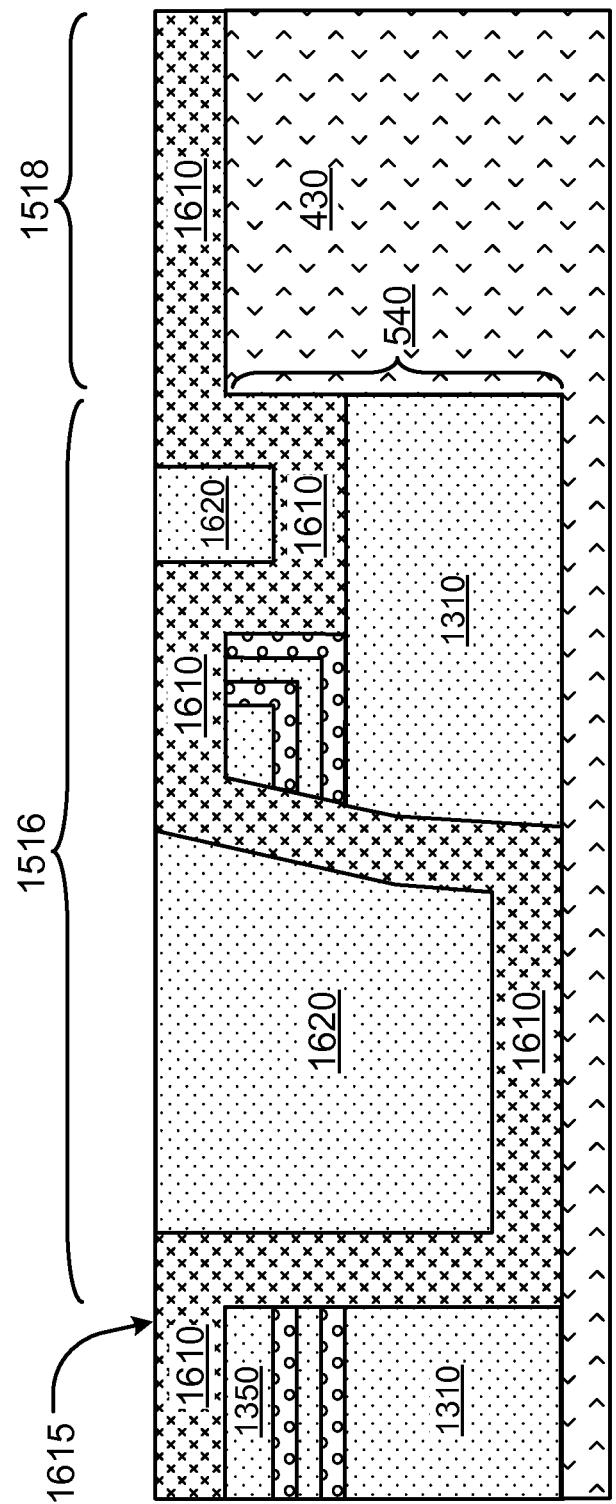
Figure 18:
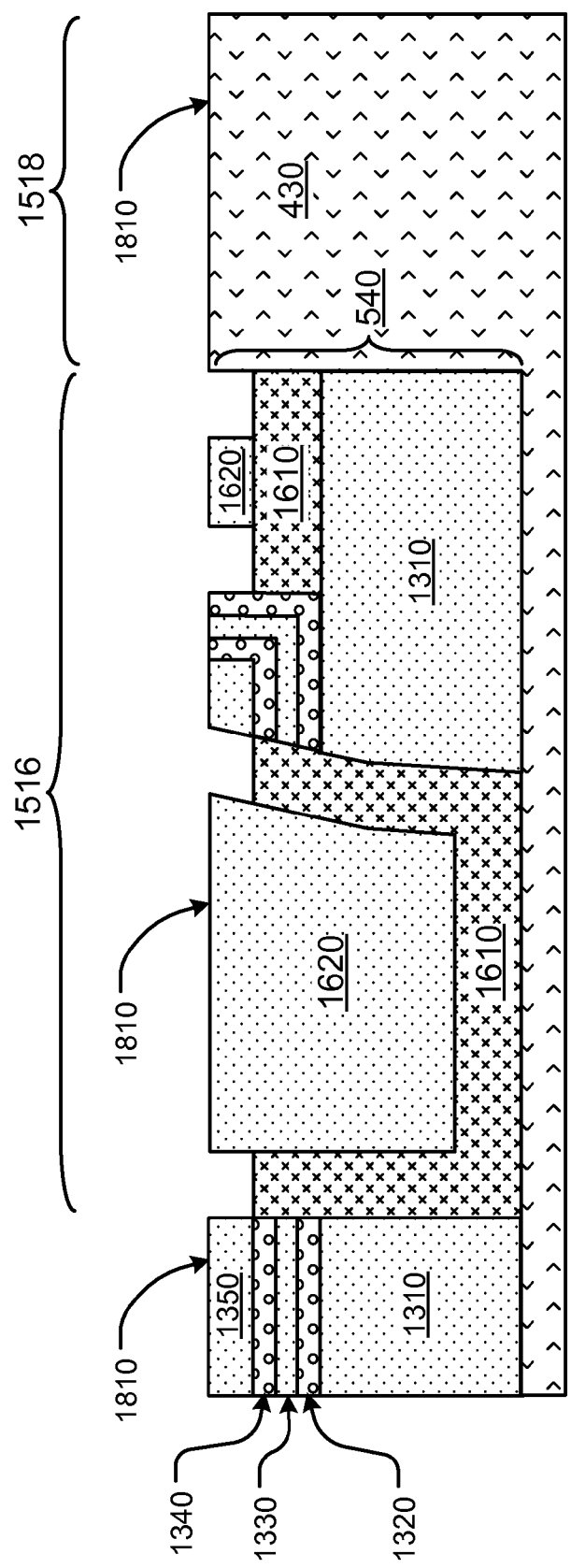

FIGS. 16-18 illustrate a planarization process to provide a planarized surface, where an uppermost one of the active layers has a top surface below the planarized surface. FIG. 16 illustrates one stage in the planarization process after the etch mask 1410 (FIG. 14) is removed. In this stage a stopping layer 1610 is formed over the stack, the isolation region 1516, and the peripheral region 1518. The stopping layer 1610 has a different etching rate from the materials below so the stopping layer 1610 slows down the etching to protect the materials below. An insulation fill 1620 is then deposited over the stopping layer 1610 to fill in the isolation region 1516.

FIG. 17 illustrates a subsequent stage in the planarization process after the insulation fill is deposited. In this stage the insulation fill 1620 is polished down to a level 1615 on or within the stopping layer 1610.

FIG. 18 illustrates another stage in the planarizing process after the insulation fill 1620 is polished down. In this stage portions of the stopping layer 1610 above a level at the top surface of the substrate is removed by a process, such as a chemical mechanical planarization process (CMP), to provide a planarized surface 1810. Components of the peripheral circuits can then be formed over the peripheral region 1518. The peripheral region 1518 is a portion of the substrate 430 that remains after the etching of the pit 520, and is separated from a stack of active layers (e.g. 1320, 1340) alternating with insulating layers (e.g. 1310, 1330, 1350) by the isolation region 1516.

Components of the peripheral circuits that can be formed over the peripheral region 1518 1810 include decoding circuitry such as described for the memory devices illustrated in FIG. 1 and FIG. 2. For instance, the decoding circuitry as described for the memory device illustrated in FIG. 2 can include word line decoding circuits, string selection line decoding circuits, and the ground selection line decoding circuits. Components of the peripheral circuits can also include controllers, voltage generators, address generators, command decoders, gates, gate insulatings, patterned metal layers, and vias connecting patterned metal layers with other components. Components of the peripheral circuits that can be formed over the isolation region 1516 1810 and over the stack 1810 also include patterned metal layers, and vias. The patterned metal layers can couple components of the peripheral circuits in the peripheral region 1518 to a stack of active layers (e.g. 1320, 1340) alternating with insulating layers (e.g. 1310, 1330, 1350) in the memory cell region 312.

The present invention provides an integrated circuit device including a substrate including a first region and a second region. A recessed area, or a pit, is formed in the first region, where the pit has a depth. The integrated circuit device includes a stack of active layers alternating with insulating layers deposited in the pit. The active layers can include semiconductor or conductive materials. The insulating layers can include dielectric materials.

The stack includes a particular insulating layer in the insulating layers. The particular insulating layer has a first thickness, where a sum of the first thickness of the particular insulating layer, thickness of active layers, and thicknesses of other insulating layers in the stack is essentially equal to the depth of the pit. The first thickness is different than the thicknesses of the other insulating layers in the stack by an amount within a range of process variations for the depth of the pit, for the thicknesses of the active layers, and for the thicknesses of insulating layers in completed stack other than the particular insulating layer. The integrated circuit device includes a planarized surface over the first region and the second region, where an uppermost one of the active layers has a top surface below the planarized surface.

As illustrated in FIG. 7, the particular insulating layer includes a bottom insulating layer 610 formed on a bottom 510 of the pit 520, in a first embodiment. A sum of the first thickness of the particular insulating layer, thickness of active layers, and thicknesses of other insulating layers is essentially equal to the target depth of the pit.

As illustrated in FIG. 9, the particular insulating layer 810 is formed on a bottom insulating layer 610 in the pit 520, in a second embodiment. A sum of the first thickness of the particular insulating layer, a second thickness of the bottom insulating layer, thickness of active layers, and thicknesses of other insulating layers is essentially equal to the target depth of the pit.

As illustrated in FIG. 11, an uppermost one of the insulating layers (e.g. 1050) is formed on the uppermost one of the active layers (e.g. 1040), and the particular insulating layer (e.g. 1110) is formed on the uppermost one of the insulating layers (e.g. 1050), in a third embodiment.

As illustrated in FIG. 12B, the particular insulating layer includes an intermediate insulating layer (e.g. 1250) formed between two adjacent active layers (e.g. 1240, 1260), in a fourth embodiment.

As illustrated in FIG. 18, the integrated circuit device further includes an isolation region (e.g. 1516) in the pit separating the stack from the second region including a peripheral region (e.g. 1518), and a stopping layer (e.g. 1610) between the stack and the isolation region and between the isolation region and the peripheral region. The stack includes active layers (e.g. 1320, 1340) and insulating layers (e.g. 1310, 1330, 1350).

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit device, comprising:
   a substrate including a first region and a second region;
   a pit formed in the first region, the pit having a depth;
   a stack of active layers alternating with insulating layers deposited in the pit, wherein the stack includes:
      a particular insulating layer having a first thickness, wherein a sum of the first thickness of the particular insulating layer, thicknesses of active layers, and thicknesses of other insulating layers in the stack is essentially equal to the depth, the first thickness being different than the thicknesses of the other insulating layers in the stack by an amount within a range of process variations for the depth of the pit, for the thicknesses of active layers, and for the thicknesses of other insulating layers; and
   a planarized surface over the first region and the second region, wherein an uppermost one of the active layers has a top surface below the planarized surface;
   the integrated circuit device further comprising:
   an isolation region in the pit separating the stack from the second region including a peripheral region; and
   a stopping layer between the stack and the isolation region and between the isolation region and the peripheral region.

2. The integrated circuit device of claim 1, further comprising components of peripheral circuits over the peripheral region.

3. The integrated circuit device of claim 1, wherein the particular insulating layer includes a bottom insulating layer formed on a bottom of the pit.

4. The integrated circuit device of claim 1, wherein the particular insulating layer is formed on a bottom insulating layer formed on a bottom of the pit, wherein a sum of the first thickness of the particular insulating layer, a second thickness of the bottom insulating layer, thicknesses of active layers, and thicknesses of other insulating layers in the stack is essentially equal to the target depth.

5. The integrated circuit device of claim 1, wherein an uppermost one of the insulating layers is formed on the uppermost one of the active layers, and the particular insulating layer having the first thickness is formed on the uppermost one of the insulating layers.

6. The integrated circuit device of claim 1, wherein the particular insulating layer includes an intermediate insulating layer formed between two adjacent active layers.

7. The integrated circuit device of claim 1, further comprising:
   interlayer connectors connected to respective active layers in the stack, the interlayer connectors extending from the respective active layers in the stack in the pit to a connector surface higher than the planarized surface; and
   patterned conductor lines on top of the connector surface and connected to the respective interlayer connectors.

8. The integrated circuit device of claim 1, further comprising:
   a plurality of active strips including at least a plurality of planes of active strips;
   a plurality of structures arranged orthogonally over, and having surfaces conformal with, the plurality of active strips in the plurality of planes; and
   memory elements in interface regions at cross-points between side surfaces of active strips in the plurality of planes and the plurality of structures.

* * * * *